(12) United States Patent
Walvoort et al.

(10) Patent No.: US 12,731,754 B2
(45) Date of Patent: Sep. 8, 2026

(54) ELECTRON-OPTICAL ASSEMBLY COMPRISING ELECTROMAGNETIC SHIELDING

(71) Applicant: ASML Netherlands B.V., Veldhoven (NL)

(72) Inventors: Derk Ferdinand Walvoort, Pijnacker (NL); Dmitry Mudretsov, Delft (NL); Xuerang Hu, San Jose, CA (US); Qingpo Xi, Fremont, CA (US); Jurgen Van Soest, Amersfoort (NL); Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 462 days.

(21) Appl. No.: 18/118,701

(22) Filed: Mar. 7, 2023

(65) Prior Publication Data

US 2023/0317402 A1 Oct. 5, 2023

Related U.S. Application Data

(63) Continuation of application No. PCT/EP2021/072716, filed on Aug. 16, 2021.

(60) Provisional application No. 63/126,932, filed on Dec. 17, 2020, provisional application No. 63/075,289, filed on Sep. 7, 2020.

(51) Int. Cl.
*H01J 37/09* (2006.01)

(52) U.S. Cl.
CPC ......... *H01J 37/09* (2013.01); *H01J 2237/024* (2013.01); *H01J 2237/0266* (2013.01)

(58) Field of Classification Search
CPC ...... H01J 37/09; H01J 37/165; H01J 37/3177; H01J 2237/024; H01J 2237/0266
See application file for complete search history.

(56) References Cited

U.S. PATENT DOCUMENTS

2001/0025932 A1 10/2001 Nakasuji
2002/0096640 A1 7/2002 Tanaka
2006/0289781 A1 12/2006 Tanimoto et al.
(Continued)

FOREIGN PATENT DOCUMENTS

JP H6-68829 A 3/1994
JP 2001284239 A * 10/2001 .......... H01J 37/3174
(Continued)

OTHER PUBLICATIONS

International Search Report issued in related PCT International Application No. PCT/EP2021/072716; mailed Dec. 3, 2021 (3 pgs.).

*Primary Examiner* — David E Smith
(74) *Attorney, Agent, or Firm* — FINNEGAN, HENDERSON, FARABOW, GARRETT & DUNNER, LLP

(57) ABSTRACT

Disclosed herein is an electron-optical assembly for an electron-optical column for projecting a charged particle beam along a beam path towards a target, the electron-optical assembly comprising: electromagnetic shielding surrounding the charged particle beam path and configured to shield the charged particle beam from an electromagnetic field external to the electromagnetic shielding; wherein the electromagnetic shielding comprises a plurality of sections extending along different positions along the beam path, each section surrounding the charged particle beam, wherein the sections are separable.

18 Claims, 16 Drawing Sheets

(56) References Cited

U.S. PATENT DOCUMENTS

| | | | | |
|---|---|---|---|---|
| 2012/0145900 | A1 | 6/2012 | Chen et al. | |
| 2015/0014530 | A1 * | 1/2015 | Ominami ................ | H01J 37/18 250/311 |
| 2015/0124229 | A1 * | 5/2015 | Van Veen .............. | H01J 37/147 355/30 |
| 2015/0311030 | A1 * | 10/2015 | Platzgummer ........ | H01J 37/147 250/396 R |
| 2016/0064180 | A1 * | 3/2016 | Ren ..................... | H01J 37/1475 250/307 |
| 2017/0148608 | A1 * | 5/2017 | Adamec .................. | H01J 37/09 |

FOREIGN PATENT DOCUMENTS

| | | | |
|---|---|---|---|
| JP | 2004014909 | A | 1/2004 |
| JP | 2013175377 | A | 9/2013 |
| JP | 2015023064 | A | 2/2015 |
| JP | 2015517735 | A | 6/2015 |
| JP | 2015211040 | A | 11/2015 |
| TW | 539845 | B | 7/2003 |
| WO | WO 2013/171214 | A1 | 11/2013 |
| WO | WO 2013/171229 | A1 | 11/2013 |

* cited by examiner

ELECTRON-OPTICAL ASSEMBLY COMPRISING ELECTROMAGNETIC SHIELDING

CROSS-REFERENCE TO RELATED APPLICATIONS

This application claims priority of International application PCT/EP2021/072716, which was filed on 16 Aug. 2021, which claims priority of U.S. application Ser. No. 63/075,289, which was filed on 7 Sep. 2020, and or EP application 20200740.7, which was filed on 8 Oct. 2020, and of U.S. application Ser. No. 63/126,932, which was filed on 17 Dec. 2020. These applications are each incorporated herein by reference in their entireties.

FIELD

The embodiments provided herein generally relate to the provision of an electron-optical assembly, a module and an electron-optical column, for example for use in a charged particle beam inspection apparatus. Embodiments also provide a method for making an electron-optical assembly, a method for replacing a module and a method for projecting a charged particle beam along a beam path towards a target.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a target at a relatively low landing energy. The beam of electrons is focused as a probing spot on the target. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the target. By scanning the primary electron beam as the probing spot over the target surface, secondary electrons can be emitted across the surface of the target. By collecting these emitted secondary electrons from the target surface, a pattern inspection tool may obtain an image representing characteristics of the material structure of the surface of the target.

Another application for an electron-optical column is lithography. The charged particle beam reacts with a resist layer on the surface of a substrate. A desired pattern in the resist can be created by controlling the locations on the resist layer that the charged particle beam is directed towards.

An electron-optical column may be an apparatus for generating, illuminating, projecting and/or detecting one or more beams of charged particles. The path of the beam of charged particles is controlled by electromagnetic fields. Stray electromagnetic fields can undesirably divert the beam.

There is a general need to improve the control of the path of the beam of charged particles.

SUMMARY

According to some embodiments of the present disclosure, there is provided an electron-optical assembly for an electron-optical column for projecting a charged particle beam along a beam path towards a target, the electron-optical assembly comprising: electromagnetic shielding surrounding the charged particle beam path and configured to shield the charged particle beam from an electromagnetic field external to the electromagnetic shielding; wherein the electromagnetic shielding comprises a plurality of sections extending along different positions along the beam path, each section surrounding the charged particle beam path, wherein the sections are separable.

According to some embodiments of the present disclosure, there is provided a module comprising an electron-optical device and an electromagnetic shielding of a beam path through the module when in an electron-optical column for projecting a charged particle beam along the beam path towards a target, the electromagnetic shielding comprising an up-beam section up-beam of the electron-optical device and a down-beam section down-beam of the electron-optical device, at least one of the up-beam and down-beam sections having an interface that extends in a direction radial to the beam path.

According to some embodiments of the present disclosure, there is provided an electron-optical assembly for an electron-optical column for projecting a charged particle beam along a beam path towards a target, the electron-optical assembly comprising: electromagnetic shielding surrounding the charged particle beam path and configured to shield the charged particle beam from an electromagnetic field external to the electromagnetic shielding; wherein the electromagnetic shielding comprises a plurality of sections extending along, and surrounding, the beam path, each section surrounding the charged particle beam path, wherein at least two of the sections are separable and comprise adjoining ends which electromagnetically engage with each other.

According to some embodiments of the present disclosure, there is provided a method for making an electron-optical assembly for an electron-optical column for projecting a charged particle beam along a beam path towards a target, the method comprising: providing electromagnetic shielding to surround the charged particle beam and to shield the charged particle beam from an electromagnetic field external to the electromagnetic shielding; wherein the electromagnetic shielding comprises a plurality of sections extending along different positions along the beam path, each section surrounding the charged particle beam path, wherein the sections are separable.

According to some embodiments of the present disclosure, there is provided a method for replacing a module of an electron-optical column for projecting a charged particle beam along a beam path towards a target, the method comprising: removing the module from the electron-optical column, wherein the electron-optical column comprises electromagnetic shielding surrounding the charged particle beam path and configured to shield the charged particle beam from an electromagnetic field external to the electromagnetic shielding; wherein the electromagnetic shielding comprises a plurality of sections extending along different positions along the beam path, each section surrounding the charged particle beam path, wherein at least one of the sections is comprised in the module and is separable from others of the section up-beam and/or down-beam of the module.

According to some embodiments of the present disclosure, there is provided a method for projecting a charged particle beam along a beam path towards a target, the method comprising: shielding the charged particle beam from an electromagnetic field external to the electromagnetic shielding; wherein the electromagnetic shielding comprises a plurality of sections extending along different positions along the beam path, each section surrounding the charged particle beam path, wherein the sections are separable.

According to some embodiments of the present disclosure, there is provided a method operating an electron-optical assembly configured to project a charged particle beam along a beam path towards a target, the assembly comprising a plurality of electromagnetic shielding sections configured to shield the charged particle beam from an electromagnetic field external to the electromagnetic shielding and a module comprising an electron-optical device and configured to be removeable from the assembly, the method comprising: removing the module from the assembly, wherein the removing comprises radially moving a section of the electromagnetic shielding within the module, relative to the beam path.

According to some embodiments of the present disclosure, there is provided a multi-column apparatus comprising: electron-optical columns configured to project respective charged particle beams along respective beam paths towards a target; a charged particle source configured to generate the charged particle beam for one or more of the electron-optical columns; and electromagnetic shielding surrounding the charged particle beam path of at least one of the electron-optical columns; wherein the electromagnetic shielding comprises a plurality of sections extending along different positions along the respective beam path, each section surrounding the charged particle beam path, wherein the sections are separable.

Advantages of the embodiments of the present disclosure will become apparent from the following description taken in conjunction with the accompanying drawings wherein are set forth, by way of illustration and example, certain examples.

BRIEF DESCRIPTION OF FIGURES

The above and other aspects of the present disclosure will become more apparent from the description of exemplary embodiments, taken in conjunction with the accompanying drawings.

FIG. 1 is a schematic diagram illustrating an exemplary charged particle beam inspection apparatus.

FIG. 4 is a schematic diagram of an electron-optical assembly according to some embodiments of the present disclosure.

Figure 2:
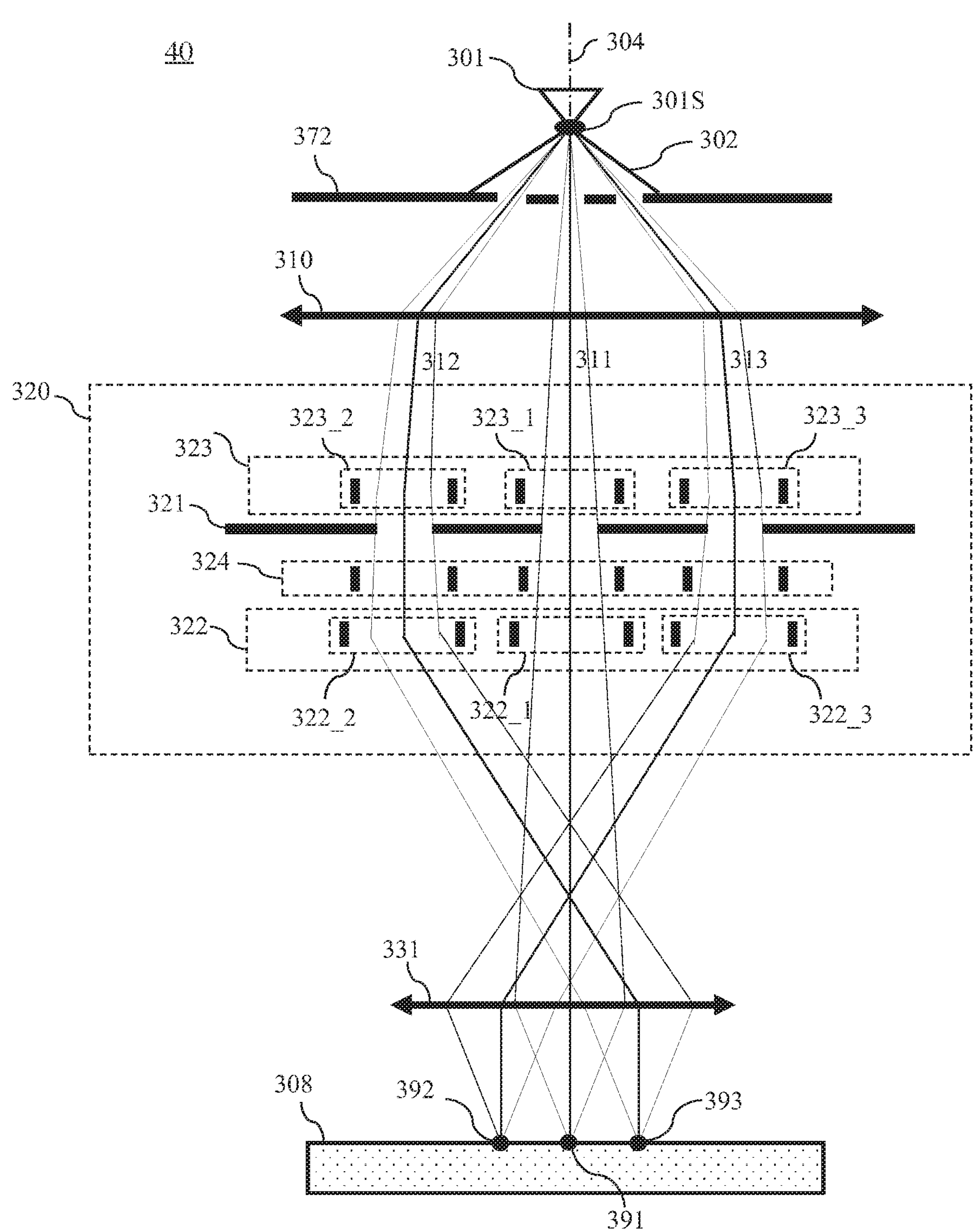
FIG. 2 is a schematic diagram illustrating an exemplary multi-beam electron-optical column that is part of the exemplary inspection apparatus of FIG. 1.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the invention as recited in the appended claims.

DETAILED DESCRIPTION

The reduction of the physical size of devices, and enhancement of the computing power of electronic devices, may be accomplished by significantly increasing the packing density of circuit components such as transistors, capacitors, diodes, etc. on an IC chip. This has been enabled by increased resolution enabling yet smaller structures to be made. Semiconductor IC manufacturing is a complex and time-consuming process, with hundreds of individual steps. An error in any step of the process of manufacturing an IC chip has the potential to adversely affect the functioning of the final product. Just one defect could cause device failure. It is desirable to improve the overall yield of the process. For example, to obtain a 75% yield for a 50-step process (where a step may indicate the number of layers formed on a wafer), each individual step must have a yield greater than 99.4%. If an individual step has a yield of 95%, the overall process yield would be as low as 7-8%.

Maintaining a high substrate (i.e. wafer) throughput, defined as the number of substrates processed per hour, is also desirable. High process yield and high substrate throughput may be impacted by the presence of a defect. This is especially true if operator intervention is required for reviewing the defects. High throughput detection and identification of micro and nano-scale defects by inspection tools (such as a Scanning Electron Microscope ('SEM')) is desirable for maintaining high yield and low cost for IC chips.

A SEM comprises a scanning device and a detector apparatus. The scanning device comprises an illumination apparatus that comprises an electron source, for generating primary electrons, and a projection apparatus for scanning a target, such as a substrate, with one or more focused beams of primary electrons. The primary electrons interact with the target and generate interaction products, such as secondary electrons and/or backscattered electrons. The detection apparatus captures the secondary electrons and/or backscattered electrons from the target as the target is scanned so that the SEM may create an image of the scanned area of the target. A design of electron-optical tool embodying these SEM features may have a single beam. For higher throughput such as for inspection, some designs of apparatus use multiple focused beams, i.e. a multi-beam, of primary electrons. The component beams of the multi-beam may be referred to as sub-beams or beamlets. A multi-beam may scan different parts of a target simultaneously. A multi-beam inspection apparatus may therefore inspect a target much quicker, e.g. by moving the target at a higher speed, than a single-beam inspection apparatus.

In a multi-beam inspection apparatus, the paths of some of the primary electron beams are displaced away from the central axis, i.e. a mid-point of the primary electron-optical axis (also referred to herein as the charged particle axis), of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations that cause the resulting image to be blurry and out-of-focus. An example is spherical aberrations which bring the focus of each sub-beam path into a different focal plane. In particular, for sub-beam paths that are not on the central axis, the change in focal plane in the sub-beams is greater with the radial displacement from the central axis. Such aberrations and de-focus effects may remain associated with the secondary electrons from the target when they are detected, for example the shape and size of the spot formed by the sub-beam on the target will be affected. Such aberrations therefore degrade the quality of resulting images that are created during inspection.

An implementation of a known multi-beam inspection apparatus is described below.

The Figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons, and items referred with reference to electrons, throughout the present document may therefore be more generally be considered to be references to charged particles, and items referred to in reference to charged particles, with the charged particles not necessarily being electrons.

Figure 1:
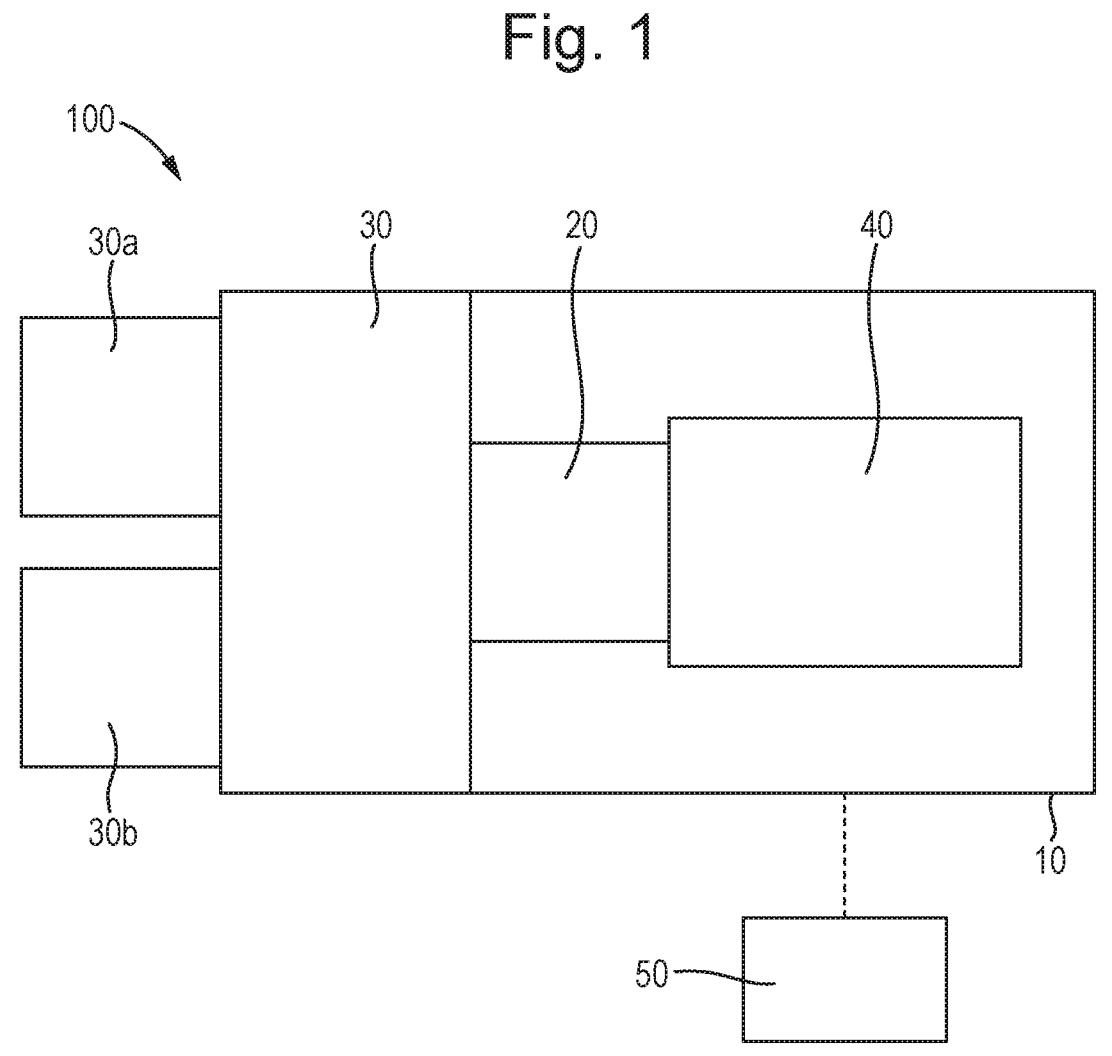

Reference is now made to FIG. 1, which is a schematic diagram illustrating an exemplary charged particle beam inspection apparatus 100. The inspection apparatus 100 of FIG. 1 includes a vacuum chamber 10, a load lock chamber 20, an electron-optical column 40 (also known as an electron beam tool), an equipment front end module (EFEM) 30 and a controller 50. The electron optical column 40 may be within the vacuum chamber 10.

The EFEM 30 includes a first loading port 30*a* and a second loading port 30*b*. The EFEM 30 may include additional loading port(s). The first loading port 30*a* and second loading port 30*b* may, for example, receive substrate front opening unified pods (FOUPs) that contain substrates (e.g., semiconductor substrates or substrates made of other material(s)) or targets to be inspected (substrates, wafers and samples are collectively referred to as "targets" hereafter). One or more robot arms (not shown) in EFEM 30 transport the targets to load lock chamber 20.

The load lock chamber 20 is used to remove the gas around a target. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. The main chamber 10 is connected to a main chamber vacuum pump system (not shown). The main chamber vacuum pump system removes gas molecules in the main chamber 10 so that the pressure around the target reaches a second pressure lower than the first pressure. After reaching the second pressure, the target is transported to the electron-optical column 40 by which it may be inspected. An electron-optical column 40 may comprise either a single beam or a multi-beam electron-optical apparatus.

The controller 50 is electronically connected to the electron-optical column 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the charged particle beam inspection apparatus or it may be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Reference is now made to FIG. 2, which is a schematic diagram of an exemplary multi-beam electron-optical column 40 of the inspection apparatus 100 of FIG. 1. In some embodiments, the inspection apparatus 100 is a single-beam inspection apparatus. The electron-optical column 40 may comprise an electron source 301, a beam former array 372

(also known as a gun aperture plate, a coulomb aperture array or a pre-sub-beam-forming aperture array), a condenser lens 310, a source converter (or micro-optical array) 320, an objective lens 331, and a target 308. In some embodiments, the condenser lens 310 is magnetic. The target 308 may be supported by a support on a stage. The stage may be motorized. The stage moves so that the target 308 is scanned by the incidental electrons. The electron source 301, the beam former array 372, the condenser lens 310 may be the components of an illumination apparatus comprised by the electron-optical column 40. The source converter 320 (also known as a source conversion unit), described in more detail below, and the objective lens 331 may be the components of a projection apparatus comprised by the electron-optical column 40.

The electron source 301, the beam former array 372, the condenser lens 310, the source converter 320, and the objective lens 331 are aligned with a primary electron-optical axis 304 of the electron-optical column 40. The electron source 301 may generate a primary beam 302 generally along the electron-optical axis 304 and with a source crossover (virtual or real) 301S. During operation, the electron source 301 is configured to emit electrons. The electrons are extracted or accelerated by an extractor and/or an anode to form the primary beam 302.

The beam former array 372 cuts the peripheral electrons of primary electron beam 302 to reduce a consequential Coulomb effect. The primary-electron beam 302 may be trimmed into a specified number of sub-beams, such as three sub-beams 311, 312 and 313, by the beam former array 372. It should be understood that the description is intended to apply to an electron-optical column 40 with any number of sub-beams such as one, two or more than three. The beam former array 372, in operation, is configured to block off peripheral electrons to reduce the Coulomb effect. The Coulomb effect may enlarge the size of each of the probe spots 391, 392, 393 and therefore deteriorate inspection resolution. The beam former array 372 reduces aberrations resulting from Coulomb interactions between electrons projected in the beam. The beam former array 372 may include multiple openings for generating primary sub-beams even before the source converter 320.

The source converter 320 is configured to convert the beam (including sub-beams if present) transmitted by the beam former array 372 into the sub-beams that are projected towards the target 308. In some embodiments, the source converter is a unit. Alternatively, the term source converter may be used simply as a collective term for the group of components that form the beamlets from the sub-beams.

As shown in FIG. 2, the electron-optical column 40 comprises a beam-limiting aperture array 321 with an aperture pattern (i.e. apertures arranged in a formation) configured to define the outer dimensions of the beamlets (or sub-beams) projected towards the target 308. In some embodiments, the beam-limiting aperture array 321 is part of the source converter 320. In some embodiments, the beam-limiting aperture array 321 is part of the system up-beam of the main column. In some embodiments, the beam-limiting aperture array 321 divides one or more of the sub-beams 311, 312, 313 into beamlets such that the number of beamlets projected towards the target 308 is greater than the number of sub-beams transmitted through the beam former array 372. In some embodiments, the beam-limiting aperture array 321 keeps the number of the sub-beams incident on the beam-limiting aperture array 321, in which case the number of sub-beams may equal the number of beamlets projected towards the target 308.

As shown in FIG. 2, the electron-optical column 40 comprises a pre-bending deflector array 323 with pre-bending deflectors 323_1, 3232, and 323_3 to bend the sub-beams 311, 312, and 313 respectively. The pre-bending deflectors 323_1, 3232, and 323_3 may bend the path of the sub-beams 311, 312, and 313 onto the beam-limiting aperture array 321.

The electron-optical column 40 may also include an image-forming element array 322 with image-forming deflectors 322_1, 3222, and 322_3. There is a respective deflector 322_1, 3222, and 322_3 associated with the path of each beamlet. The deflectors 322_1, 3222, and 322_3 are configured to deflect the paths of the beamlets towards the electron-optical axis 304. The deflected beamlets form virtual images (not shown) of source crossover 301S. In the current example, these virtual images are projected onto the target 308 by the objective lens 331 and form probe spots 391, 392, 393 thereon. The electron-optical column 40 may also include an aberration compensator array 324 configured to compensate aberrations that may be present in each of the sub-beams. In some embodiments, the aberration compensator array 324 comprises a lens configured to operate on a respective beamlet. The lens may take the form or an array of lenses. The lenses in the array may operate on a different beamlet of the multi-beam. The aberration compensator array 324 may, for example, include a field curvature compensator array (not shown) for example with micro-lenses. The field curvature compensator and micro-lenses may, for example, be configured to compensate the individual sub-beams for field curvature aberrations evident in the probe spots, 391, 392, and 393. The aberration compensator array 324 may include an astigmatism compensator array (not shown) with micro-stigmators. The micro-stigmators may, for example, be controlled to operate on the sub-beams to compensate astigmatism aberrations that are otherwise present in the probe spots, 391, 392, and 393.

The source converter 320 may further comprise a pre-bending deflector array 323 with pre-bending deflectors 323_1, 323_2, and 323_3 to bend the sub-beams 311, 312, and 313 respectively. The pre-bending deflectors 323_1, 323_2, and 323_3 may bend the path of the sub-beams onto the beam-limiting aperture array 321. In some embodiments, the pre-bending micro-deflector array 323 may be configured to bend the sub-beam path of sub-beams towards the orthogonal of the plane of on beam-limiting aperture array 321. In some embodiments, the condenser lens 310 may adjust the path direction of the sub-beams onto the beam-limiting aperture array 321. The condenser lens 310 may, for example, focus (collimate) the three sub-beams 311, 312, and 313 to become substantially parallel beams along primary electron-optical axis 304, so that the three sub-beams 311, 312, and 313 incident substantially perpendicularly onto source converter 320, which may correspond to the beam-limiting aperture array 321. In such an example, the pre-bending deflector array 323 may not be necessary.

The image-forming element array 322, the aberration compensator array 324, and the pre-bending deflector array 323 may comprise multiple layers of sub-beam manipulating devices, some of which may be in the form or arrays, for example: micro-deflectors, micro-lenses, or micro-stigmators. Beam paths may be manipulated rotationally. Rotational corrections may be applied by a magnetic lens. Rotational corrections may additionally, or alternatively, be achieved by an existing magnetic lens such as the condenser lens arrangement.

In the current example of the electron-optical column 40, the beamlets are respectively deflected by the deflectors 322_1, 322_2, and 322_3 of the image-forming element array 322 towards the electron-optical axis 304. It should be understood that the beamlet path may already correspond to the electron-optical axis 304 prior to reaching deflector 322_1, 322_2, and 322_3.

The objective lens 331 focuses the beamlets onto the surface of the target 308, i.e., it projects the three virtual images onto the target surface. The three images formed by three sub-beams 311 to 313 on the target surface form three probe spots 391, 392 and 393 thereon. In some embodiments, the deflection angles of sub-beams 311 to 313 are adjusted to pass through or approach the front focal point of objective lens 331 to reduce or limit the off-axis aberrations of three probe spots 391 to 393. In an arrangement the objective lens 331 is magnetic. Although three beamlets are mentioned, this is by way of example only. There may be any number of beamlets.

A manipulator is configured to manipulate one or more beams of charged particles. The term manipulator encompasses a deflector, a lens and an aperture. The pre-bending deflector array 323, the aberration compensator array 324 and the image-forming element array 322 may individually or in combination with each other, be referred to as a manipulator array 34, because they manipulate one or more sub-beams or beamlets of charged particles. The lens and the deflectors 322_1, 322_2, and 322_3 may be referred to as manipulators because they manipulate one or more sub-beams or beamlets of charged particles.

In some embodiments, a beam separator (not shown) is provided. The beam separator may be down-beam of the source converter 320. The beam separator may be, for example, a Wien filter comprising an electrostatic dipole field and a magnetic dipole field. The beam separator may be positioned between adjacent sections 32 of shielding 31 (described in more detail below) in the direction of the beam path. The inner surface 39 of the shielding may be radially inward of the beam separator. Alternatively, the beam separator may be within the shielding 31. In operation, the beam separator may be configured to exert an electrostatic force by electrostatic dipole field on individual electrons of sub-beams. In some embodiments, the electrostatic force is equal in magnitude but opposite in direction to the magnetic force exerted by the magnetic dipole field of beam separator on the individual primary electrons of the sub-beams. The sub-beams may therefore pass at least substantially straight through the beam separator with at least substantially zero deflection angles. The direction of the magnetic force depends on the direction of motion of the electrons while the direction of the electrostatic force does not depend on the direction of motion of the electrons. So because the secondary electrons and backscattered electrons generally move in an opposite direction compared to the primary electrons, the magnetic force exerted on the secondary electrons and backscattered electrons will no longer cancel the electrostatic force and as a result the secondary electrons and backscattered electrons moving through the beam separator will be deflected away from the electron-optical axis 304.

In some embodiments, a secondary column (not shown) is provided comprising detection elements for detecting corresponding secondary charged particle beams. On incidence of secondary beams with the detection elements, the elements may generate corresponding intensity signal outputs. The outputs may be directed to an image processing system (e.g., controller 50). Each detection element may comprise one or more pixels. The intensity signal output of a detection element may be a sum of signals generated by all the pixels within the detection element.

In some embodiments, a secondary projection apparatus and its associated electron detection device (not shown) are provided. The secondary projection apparatus and its associated electron detection device may be aligned with a secondary electron-optical axis of the secondary column. In some embodiments, the beam separator is arranged to deflect the path of the secondary electron beams towards the secondary projection apparatus. The secondary projection apparatus subsequently focuses the path of secondary electron beams onto a plurality of detection regions of the electron detection device. The secondary projection apparatus and its associated electron detection device may register and generate an image of the target 308 using the secondary electrons or backscattered electrons.

In some embodiments, the inspection apparatus 100 comprises a single source.

Any element or collection of elements may be replaceable or field replaceable within the electron-optical column. The one or more electron-optical components in the column, especially those that operate on sub-beams or generate sub-beams, such as aperture arrays and manipulator arrays may comprise one or more microelectromechanical systems (MEMS). The pre-bending deflector array 323 may be a MEMS. MEMS are miniaturized mechanical and electromechanical elements that are made using microfabrication techniques. In some embodiments, the electron-optical column 40 comprises apertures, lenses and deflectors formed as MEMS. In some embodiments, the manipulators such as the lenses and deflectors 322_1, 322_2, and 322_3 are controllable, passively, actively, as a whole array, individually or in groups within an array, so as to control the beamlets of charged particles projected towards the target 308.

In some embodiments, the electron-optical column 40 may comprise alternative and/or additional components on the charged particle path, such as lenses and other components some of which have been described earlier with reference to FIGS. 1 and 2. In particular, embodiments include an electron-optical column 40 that divides a charged particle beam from a source into a plurality of sub-beams. A plurality of respective objective lenses may project the sub-beams onto a sample. In some embodiments, a plurality of condenser lenses is provided up-beam from the objective lenses. The condenser lenses focus each of the sub-beams to an intermediate focus up-beam of the objective lenses. In some embodiments, collimators are provided up-beam from the objective lenses. Correctors may be provided to reduce focus error and/or aberrations. In some embodiments, such correctors are integrated into or positioned directly adjacent to the objective lenses. Where condenser lenses are provided, such correctors may additionally, or alternatively, be integrated into, or positioned directly adjacent to, the condenser lenses and/or positioned in, or directly adjacent to, the intermediate foci. A detector is provided to detect charged particles emitted by the sample. The detector may be integrated into the objective lens. The detector may be on the bottom surface of the objective lens so as to face a sample in use. The condenser lenses, objective lenses and/or detector may be formed as MEMS or CMOS devices.

Figure 3:
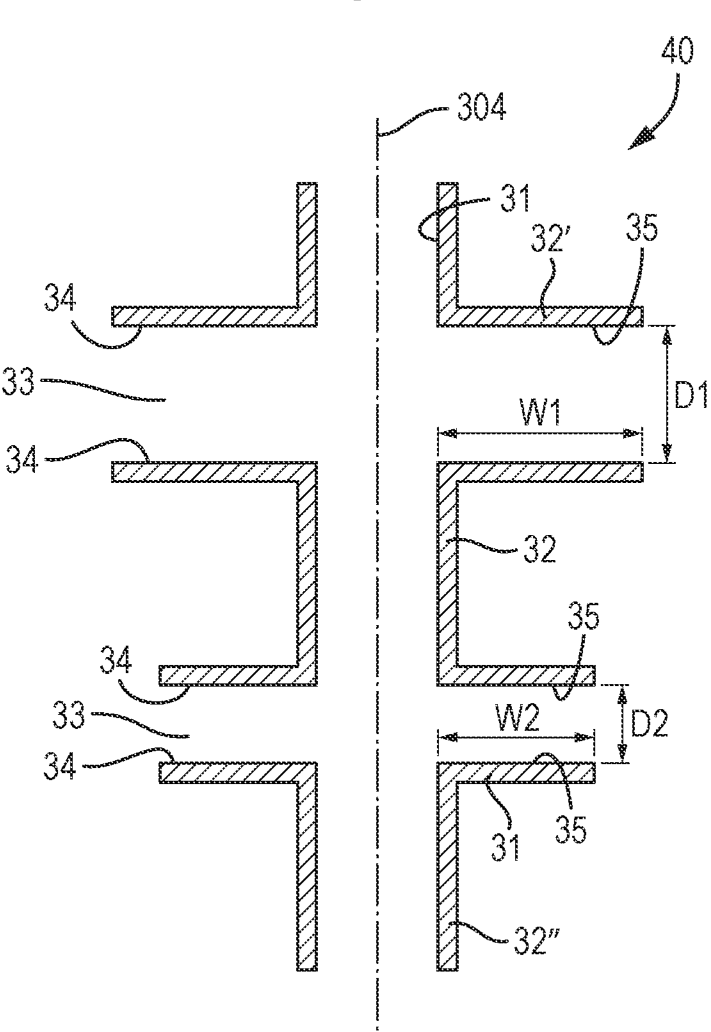
FIG. 3 is a schematic diagram of an electron-optical assembly according to some embodiments of the present disclosure.

FIG. 3 depicts an electron-optical assembly according to some embodiments of the present disclosure. The electron-optical assembly is for an electron-optical column 40. The electron-optical column 40 is for projecting a charged particle beam along a beam path towards a target 308. In some embodiments, the beam path is in the axial direction of the electron-optical column 40. The axial direction corresponds to the electron-optical axis 304. Alternatively, the beam path may be angled relative to the electron-optical axis 304.

As shown in FIG. 3, the electron-optical assembly comprises electromagnetic shielding 31. The electromagnetic shielding is configured to surround the charged particle beam. The electromagnetic shielding 31 is configured to shield the charged particle beam from an electromagnetic field external to the electromagnetic shielding 31.

In the electron-optical column 40, the path of the charged particle beam is controlled by electromagnetic fields. For example, internal electromagnetic fields may be used to control the charged particle beam path; that is internal to the shielding 31. The internal electromagnetic fields are therefore pre-determined in the design and operation of the electron-optical assembly. External (i.e. stray) electromagnetic fields may undesirably divert the charged particle beam from its intended path. Here external is external to the shielding. The electromagnetic shielding 31 is configured to attenuate external electromagnetic fields. The electromagnetic shielding 31 is configured to reduce the effect of external electromagnetic fields on the charged particle beam path.

In some embodiments, the electromagnetic shielding 31 is configured to shield the charged particle beam from an electric field. In some embodiments, the electromagnetic shielding 31 comprises conducting material. For example, the electromagnetic shielding 31 may comprise an electrically conductive material such as a metal such as copper, nickel, iron or cobalt, or a doped semiconductor, or a metal coating. Such a metal coating may be provided on a metallic or non-metallic material such as plastic. The shielding 31 may have low resistance connections to its ground connection. By surrounding the beam with a low ohmic material, the effect of stray electric fields can be attenuated. In some embodiments, the electromagnetic shielding 31 is connected to a DC potential. In some embodiments, the DC potential is ground potential. Alternatively, the DC potential may be a fixed potential different from ground so as to provide an electrostatic lens.

In some embodiments, the electromagnetic shielding 31 is configured to shield the charged particle beam from a magnetic field. In some embodiments, the electromagnetic shielding 31 comprises a magnetically permeable material. For example, the electromagnetic shielding 31 may comprise an alloy. The alloy may comprise nickel and/or iron and/or cobalt. In some embodiments, the electromagnetic shielding 31 comprises one or more rare earth elements. In some embodiments, the electromagnetic shielding 31 comprises a material having a relative permeability of at least 5,000, 10,000, optionally at least 20,000, optionally at least 50,000 and optionally at least 100,000. In some embodiments, the electromagnetic shielding 31 is heat treated. In some embodiments, the electromagnetic shielding 31 undergoes a magnetic annealing process. In some embodiments, the electromagnetic shielding 31 is heated in a hydrogen atmosphere.

As shown in FIG. 3, the electromagnetic shielding 31 comprises a plurality of sections 32. The sections 32 of electromagnetic shielding 31 extend along different positions along the beam path. In the orientation shown in FIG. 3, the beam path extends from top to bottom. Three sections 32 are shown in FIG. 3. The middle section 32 extends along a portion of the beam path down-beam of the top section 32 and up-beam of the bottom section 32 shown. Each section 32 is configured to surround the charged particle beam. The beam may be a multi-beam.

As shown in FIG. 3, the sections 32 of electromagnetic shielding 31 are separable. By providing that the sections 32 are separable, it is easier to disassemble part of the electron-optical column 40 and/or to replace one or more parts of the electron-optical column 40. Parts of the electron-optical column 40 can be removed one-by-one. The sections 32 can be removed one-by-one so as to remove and/or replace part of the electron-optical column 40. At least some embodiments are expected to make it easier to maintain the electron-optical column 40.

In FIG. 3 (and in several other Figures), the electromagnetic shielding 31 is shown as being positioned symmetrically around the beam path. In practice the origin and direction of the external stray fields may be unknown. Symmetrical electromagnetic shielding 31 may have a predetermined attenuation factor regardless of the direction of the stray fields. However, it is not essential for the electromagnetic shielding 31 to be positioned symmetrically around the beam path. The electromagnetic shielding may be positioned off-center from the beam path. In some situations, the direction of the external field may be known (e.g. because the source of the field is known). In some embodiments, the electromagnetic shielding 31 is designed so as to attenuate the effect of a field in a certain direction more than another direction.

As shown in FIG. 3, the sections 32 are arranged such that a gap 33 in the electromagnetic shielding 31 is formed in the direction of the beam path, between adjacent sections 32. For example, two gaps 33 are shown between the three sections 32. The three exemplary sections may be referred to as an up beam section 32' up beam of middle section 32, and a down beam section 32" down beam of middle section 32. As shown in FIG. 3, the sections 32 are arranged such that at least one section 32, for example the middle section 32, is moveable in a direction radial to the beam path independently of another of the sections 32, for example the up beam and down beam sections 32', 32". In the orientation shown in FIG. 3, the radial direction is the left-right direction, i.e. across between the vertical sides of the page. In some embodiments, one of the sections 32 is shiftable in a direction angled, preferably perpendicular to the beam path independently of another of the sections 32. In some embodiments, the section 32 is shiftable independently of another of the sections 32 in a direction angled to the direction perpendicular to the beam path.

At least some embodiments of the present disclosure are expected to make it easier to remove and/or replace a part midway along the electron-optical column 40. Disassembly and assembly can be done by moving the sections 32 in a direction angled, and optionally perpendicular, to the beam path. Disassembly and assembly may also be possible by moving the sections 32 in the direction of the beam path, e.g. by removing the sections one-by-one. The gap 33 makes it easier for a section 32 to be shifted into or out from the beam path independently of (e.g. without contacting or disturbing) other sections 32. In some embodiments, the shielding 31 comprises an aperture through which the beam path extends. In some embodiments, the aperture has a dimension of at least 2 mm, optionally at least 5 mm in the direction perpendicular to the beam path. In some embodiments, the beam has a dimension in the region of 1-2 mm. The beam fits in the aperture before and after replacement of a section 32 of shielding 31.

As shown in FIG. 3, adjacent sections 32 have facing surfaces 34. The facing surface 34 of one section faces the facing surface 34 of an adjacent section 32 of electromagnetic shielding 31. The facing surfaces 34 are arranged to extend in a direction away from the beam path, preferably radial to the beam path. The facing surfaces 34 of adjacent sections 32 may be parallel. In the arrangement shown in FIG. 3, the facing surfaces 34 of the top and middle section 32 extend further away, preferably in the radial direction, than the facing surfaces 34 of the middle and bottom sections 32. In some embodiments, the facing surface 34 define the extent of the gap 33 in the direction of the beam path.

In some embodiments, the facing surfaces 34 extend away from the beam path, preferably in the radial direction, by a distance at least as large as the gap 33 between the adjacent sections 32. As shown in FIG. 3, the gap 33 between the top and middle sections 32 has a distance D1. The distance D1 is measured in the direction of the beam path. The facing surfaces 34 on either side of the gap 33 extend away from the beam path, preferably in the radial direction, by a width W1. The width W1 is measured in the radial direction, which may be perpendicular to the direction of the beam path. The width W1 is measured from the inner surface of the section 32 to the radially outer edge of the facing surfaces 34. In some embodiments, W1>D1. That is the width W1 may be greater to or equal to the distance D1.

As shown in FIG. 3, the gap 33 between the bottom and middle sections 32, 32' has a distance D2 in a direction parallel to the beam path. The facing surfaces 34 on either side of the gap 33 extend in the radial direction, e.g. relative to the beam path, a width W2. In some embodiments, W2≥D2. That is the width W2 may be greater to or equal to the distance D2.

The radial extent of the facing surfaces 34 can help the sections 32 attenuate the effect of stray electromagnetic fields. In general, increasing the radial extent of the facing surfaces 34 relative to the size of the gap 33 reduces the effect of stray electromagnetic fields. In some embodiments, the facing surfaces 34 extend in the radial direction by a distance at least twice as large as the gap 33 between the adjacent sections 32. In some embodiments, the facing surfaces 34 extend in the radial direction by a distance at least three times as large as the gap 33 between the adjacent sections 32. In some embodiments, the facing surfaces 34 extend in the radial direction by a distance at least four times as large as the gap 33 between the adjacent sections 32. In some embodiments, the facing surfaces 34 extend in the radial direction by a distance at least five times as large as the gap 33 between the adjacent sections 32.

In the arrangement shown in FIG. 3, the facing surfaces 34 on either side of the gap 33 extend an equal distance in the radial direction. However, this is not necessarily the case. In an alternative example, the facing surface 34 on either side of the gap 33 may extend different distances in the radial direction. In some embodiments, the shorter distance of the two facing surfaces 34 extends in the radial direction a distance at least (or twice, or three times, or four times or five times) as large as the size of the gap 33. At least some embodiments are expected to reduce the effect of stray electromagnetic fields on the beam path. In an arrangement a facing surface 34 may extend a non-uniform distance around and relative to the beam path. For example in opposing radial directions relative to the beam path, the facing surface may extend further from the beam than in the other direction.

As shown in FIG. 3, at least one end of the section 32 in the direction of the beam path comprises a flange 35 extending in a direction radial to the beam path. In some embodiments, the flange 35 comprises the facing surface 34. In some embodiments, the electromagnetic shielding is flared away from the beam path preferably radially. The flange 35 helps to increase the radial extent of the facing surface 34 without unduly increasing the thickness of the electromagnetic shielding 31. By keeping the thickness of the electromagnetic shielding 31 relatively low, the material cost of the electromagnetic shielding is limited. At least some embodiments are expected to reduce the effect of stray electromagnetic fields on the beam without unduly increasing the manufacturing cost.

Figure 4:
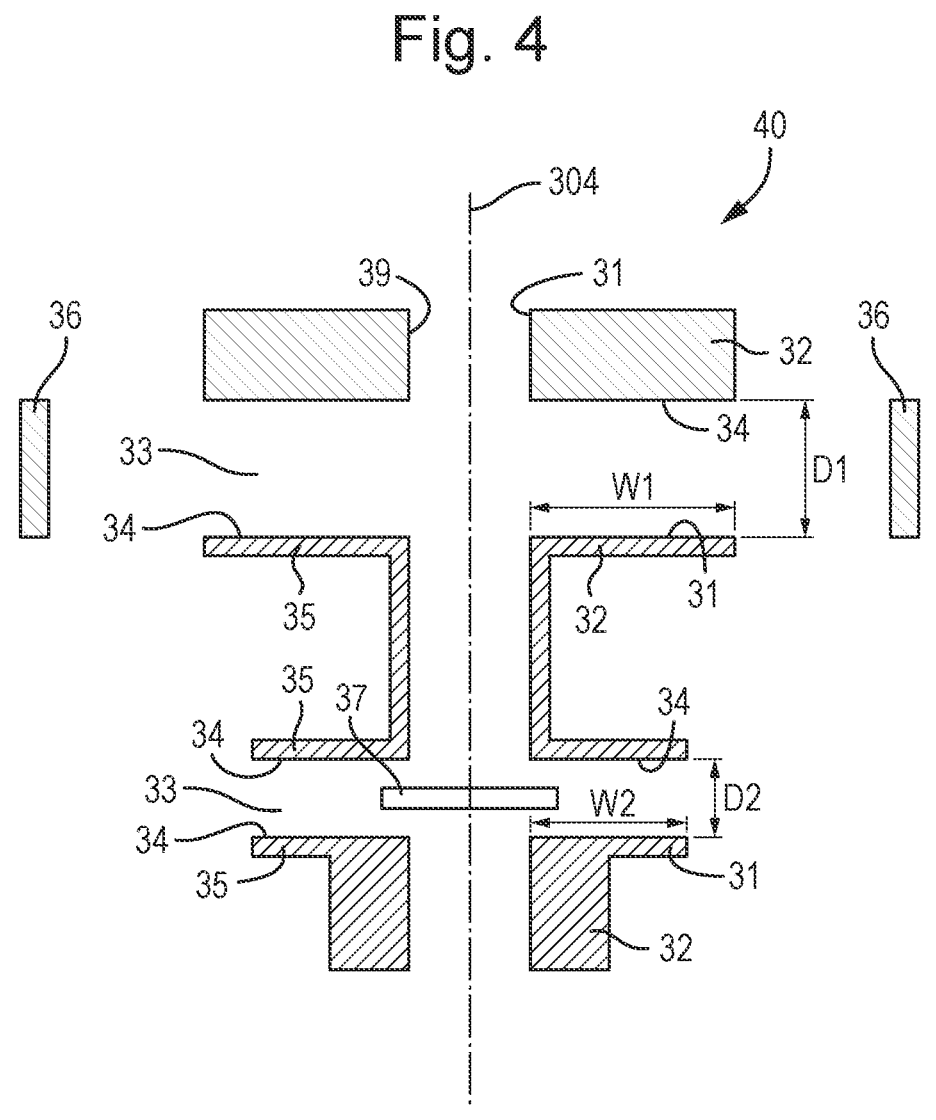

FIG. 4 schematically depicts part of an electron-optical column 40 according to some embodiments of the present disclosure. As shown in FIG. 4, it is inessential for a flange to be provided. In the arrangement shown in FIG. 4, the top section 32' of electromagnetic shielding 31 has an external diameter which may be constant. The facing surface 34 extends in the radial direction. The radial extent of the facing surface 34 is provided by increasing the thickness of the section 32 (relative to the middle section 32). The radial extent of the facing surface 34 is provided by the thickness of the top section 32. So the facing surface is provided by a wall of the shielding 31. That is the shielding is a tube with the facing surface corresponding to the end surface of the tube. The thickness of the tube, at least at its end providing the wall, may therefore define the extent of the width W1, W2 in a direction away from the beam path.

The middle section 32 shown in FIG. 4 is similar to the middle section 32 shown in FIG. 3. The bottom section 32" shown in FIG. 4 comprises a flange 35. The bottom section 32 has a wall thicker than that of the middle section 32. In the bottom section 32", the radial extent of the facing surface 34 is provided partly by increasing the thickness of the bottom section 32" (relative to the middle section 32) and partly by providing the flange 35.

As shown in FIG. 4, the electron-optical assembly comprises at least one electron-optical element between adjacent sections 32 of the electromagnetic shielding 31. The electron-optical element is configured to operate on the path of the beam. For example, one or more deflectors 36 are provided between adjacent sections 32. (The deflector is shown in cross-section in the same manner as the sections). In some embodiments, one or more lenses 37 are provided between adjacent sections 32. (As an electrostatic lens would comprise two or more plates; for the purposes of simplicity the lenses are indicated schematically). Other types of electron-optical elements may be positioned between adjacent sections 32. A magnetic lens may comprise a coil outside of the shielding 31 and a core positioned between adjacent sections 32. In some embodiments, the electron-optical element between the sections 32 is a MEMS element. For example, the deflectors 36 and/or lenses 37 may be MEMS.

In some embodiments, the electromagnetic shielding 31 is configured to extend around the path of the multi-beam. In some embodiments, the electromagnetic shielding 31 comprises multiple sections 32: an up-beam section 32' up-beam of an electron-optical element; a down-beam section 32" down-beam of the electron-optical element; and an element section 32 associated with the electron-optical element. In some embodiments, the element section 32 is configured to be removable from the tool with the electron-optical element. In some embodiments, a small gap exists between adjoining sections 32 along the beam path.

In the example shown in FIG. 4, the deflectors 36 act on the beam through the gap 33. In the example shown in FIG. 4, the deflectors 36 are positioned radially outward of the outer extent of the sections 32. In an alternative example, the deflectors 36 may be positioned at least partly inward of the outer radial extent of the sections 32. The outer radial extent of the sections 32 may correspond to length surfaces which may be parallel with direction of the beam path. In some embodiments, the deflectors 36 are in the gap 33, for example between the facing surfaces 34 defining the gap 33. Positioning the deflectors 36 closer to the beam reduces undesirable attenuation of the effect of the deflectors 36 on the beam due to the shielding 31. In some embodiments, the deflectors 36 are in line with the inner surface 39 of the sections 32. In some embodiments, the deflectors 36 are closer to the beam path than the inner surface 39 of the sections 32.

As shown in FIG. 4, the lens 37 extends radially outwards further than the radially inner edge of the sections 32 of electromagnetic shielding 31. The outer periphery of the lens 37 is within the gap 33. In some embodiments, the lens 37 is an array of lenses. Additionally or alternatively an array of deflectors or apertures may be positioned between adjacent sections 32.

Figure 5:
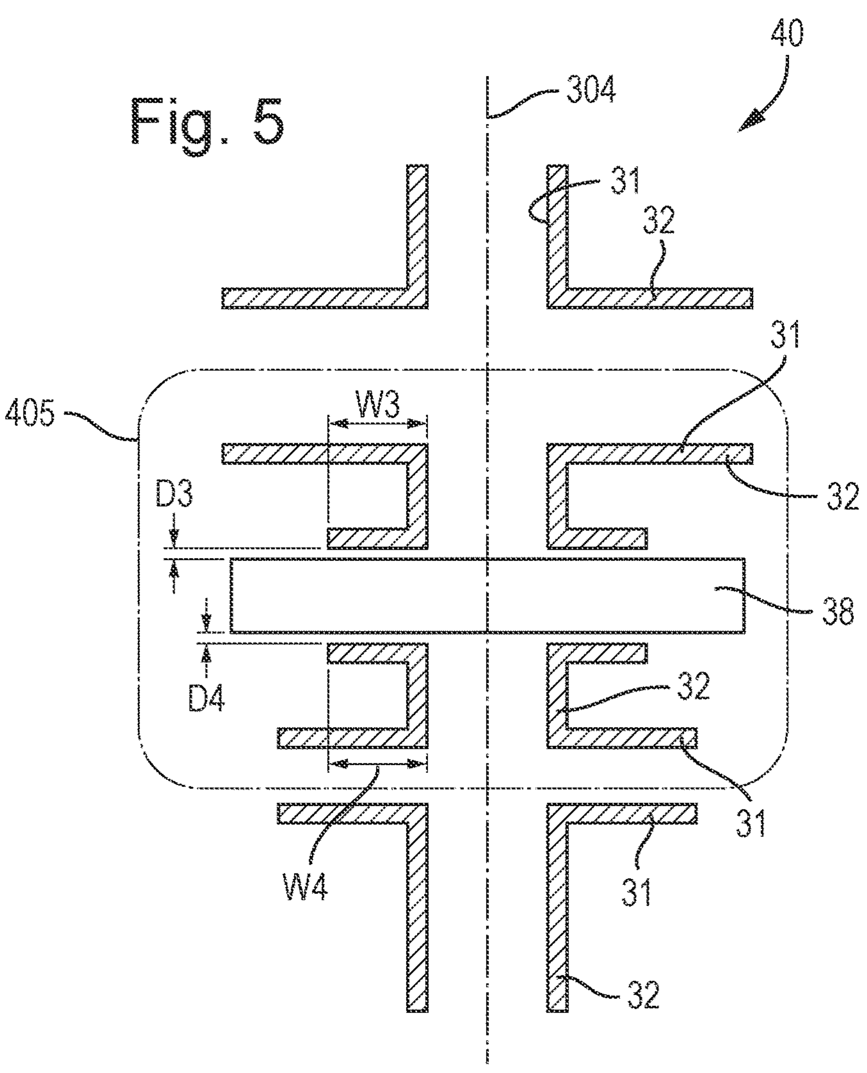
FIG. 5 is a schematic diagram of an electron-optical assembly according to some embodiments of the present disclosure.

FIG. 5 depicts part of an electron-optical column 40 according to some embodiments. As shown in FIG. 5, the electron-optical column 40 comprises a module 405. In some embodiments, the module 405 comprises the electron-optical assembly. The module 405 may comprise sections 32 of electromagnetic shielding 31. As shown in FIG. 5, the module 405 comprises an electron-optical element 38. In some embodiments, the electron-optical element 38 comprises one or more manipulators such as apertures, deflectors, and lenses. The electron optical element 38 may be an array of manipulators. In some embodiments, the electron-optical element is a MEMS element. As shown in FIG. 5, the sections 32 within the module 405 are flared. The electron-optical element comprises surface portions which face the facing surfaces 34 of the sections 32 either side of the electron-optical element 38.

In the module 405 shown in FIG. 5, two sections 32 of electromagnetic shielding 31 are provided. The electron-optical element 38 is between the sections 32. Gaps of distances D3 and D4 are formed between the sections 32 and the surface portions, i.e. the surfaces of the electron-optical element 38 in the direction of the beam path that face the facing surfaces of sections 32. With the facing surface portion, the facing surfaces of the sections 32 define corresponding gaps. The facing surfaces that define the gaps with the surface portions gaps extend distances W3 and W4 in the radial direction, respectively. In some embodiments, W3 is at least as large as D3. In some embodiments, W3 is twice (or three times or four times or five times) as large as D3. In some embodiments, W4 is at least as large as D4. In some embodiments, W4 is twice (or three times or four times or five times) as large as D4.

In some embodiments, the module 405 comprises an electron-optical component which is on a stage permitting actuation for positioning of the component. In some embodiments, the module 405 comprises a stage. In an arrangement the stage and the module may be an integral part of the electron-optical column 40. In an arrangement the module 405 is limited to the stage and the electron-optical device it supports. In an arrangement the stage is removable. In an alternative design the module 405 comprising the stage is removable. The part of the electron-optical column 40 for the module 405 is isolatable, that is the part of the electron-optical column 40 is defined by a valve up-beam and a valve down-beam of the module 405. The valves can be operated to isolate the environment between the valves from the vacuum up-beam and down-beam of the valves respectively enabling the module 405 to be removed from the electron-optical column 40 whilst maintaining the vacuum up-beam and down-beam of the part of the column associated with the module 405. In some embodiments, the module 405 comprises a stage. The stage is configured to support an electron-optical device relative to the beam path. In some embodiments, the module comprises 405 one or more actuators. The actuators are associated with the stage. The actuators are configured to move the electron-optical device relative to the beam path. In some embodiments, the actuators are external to the electromagnetic shielding 31. In some embodiments, sections 32 of the electromagnetic shielding 31 associated with the electron-optical device are provided at either side of the stage.

When an electron-optical device is alignable relative to the beam path by an actuator, at least one of the sections 32 associated with the electron-optical device may be actuatable. In some embodiments, one or more actuators is configured to actuate a section 32 of electromagnetic shielding 31 relative to a frame of the electron-optical column 40. The frame may be associated with the stage of the module 405. In some embodiments, the section 32 is actuatable relative to the stage of the module 405. In some embodiments, a section 32 is fixed relative to the electron-optical device. At least one of the shielding sections 32 may be actuatable together with the electron optical-device within the module 405, which may be MEMS.

In some embodiments, the module 405 is a MEMS module. In some embodiments, the module 405 is configured to be replaceable within the electron-optical column 40. In some embodiments, the module 405 is configured to be field replaceable. Field replaceable is intended to mean that the module may be removed and replaced with the same or different module while maintaining the vacuum in which the electron-optical column is located. Only a section of the column is vented corresponding to the module is vented for the module to be removed and returned or replaced.

In some embodiments, the module 405 comprises internal electron-optical shielding. The module can be removed, inserted or replaced without the need to retract the electromagnetic shielding 31 along the beam path. It is not necessary for the sections 32 to be axially moveable. In a conventional arrangement, the shielding is either a continuous tube which would need to be removed or a series of contiguous sections which would need to be mechanically disassembled starting at one or other end of the electron-optical column.

Figure 6:
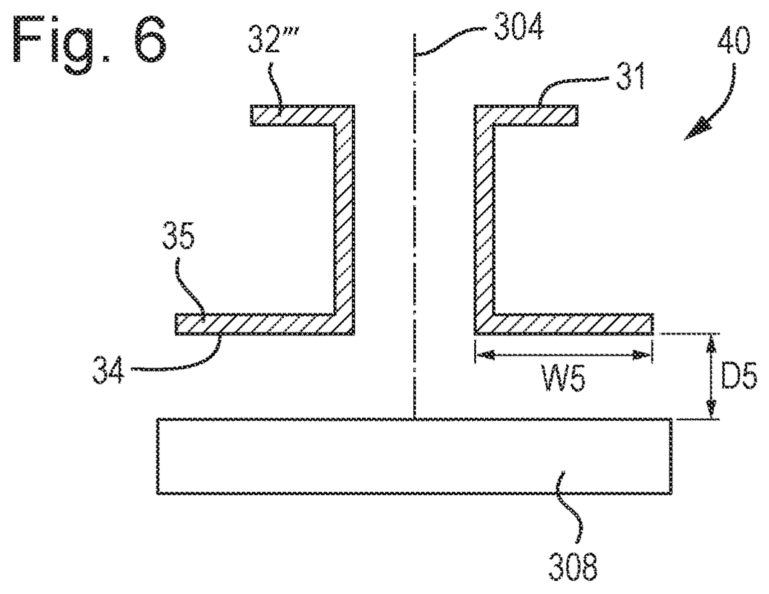
FIG. 6 is a schematic diagram of part of an electron-optical assembly according to some embodiments of the present disclosure.

FIG. 6 depicts part of an electron-optical column 40. As shown in FIG. 6, the final section 32''' of electromagnetic shielding 31 up-beam of the target 308 comprises a facing surface 34. The facing surface 34 faces the target 308. The facing surface 34 is positioned a distance D5 from the target 308. The distance D5 is in the direction of the beam path. The facing surface 34 extends away from, preferably radially relative to, the beam path a width W5. The width W5 is measured perpendicularly to the direction of the beam path. As shown in FIG. 6, the section 32 comprises a flange 35. Alternatively, as described above the radial extent of the facing surface 34 may be provided by having a thicker wall of the electromagnetic shielding 31.

In some embodiments, W5 is at least as large as D5. In some embodiments, W5 is twice (or three times or four times or five times) as large as D5. As shown in FIG. 6, the target 308 extends radially at least as far as the width W5. The target 308 may contribute to attenuating the effect of stray electromagnetic fields on the beam.

Figures 7, 8:
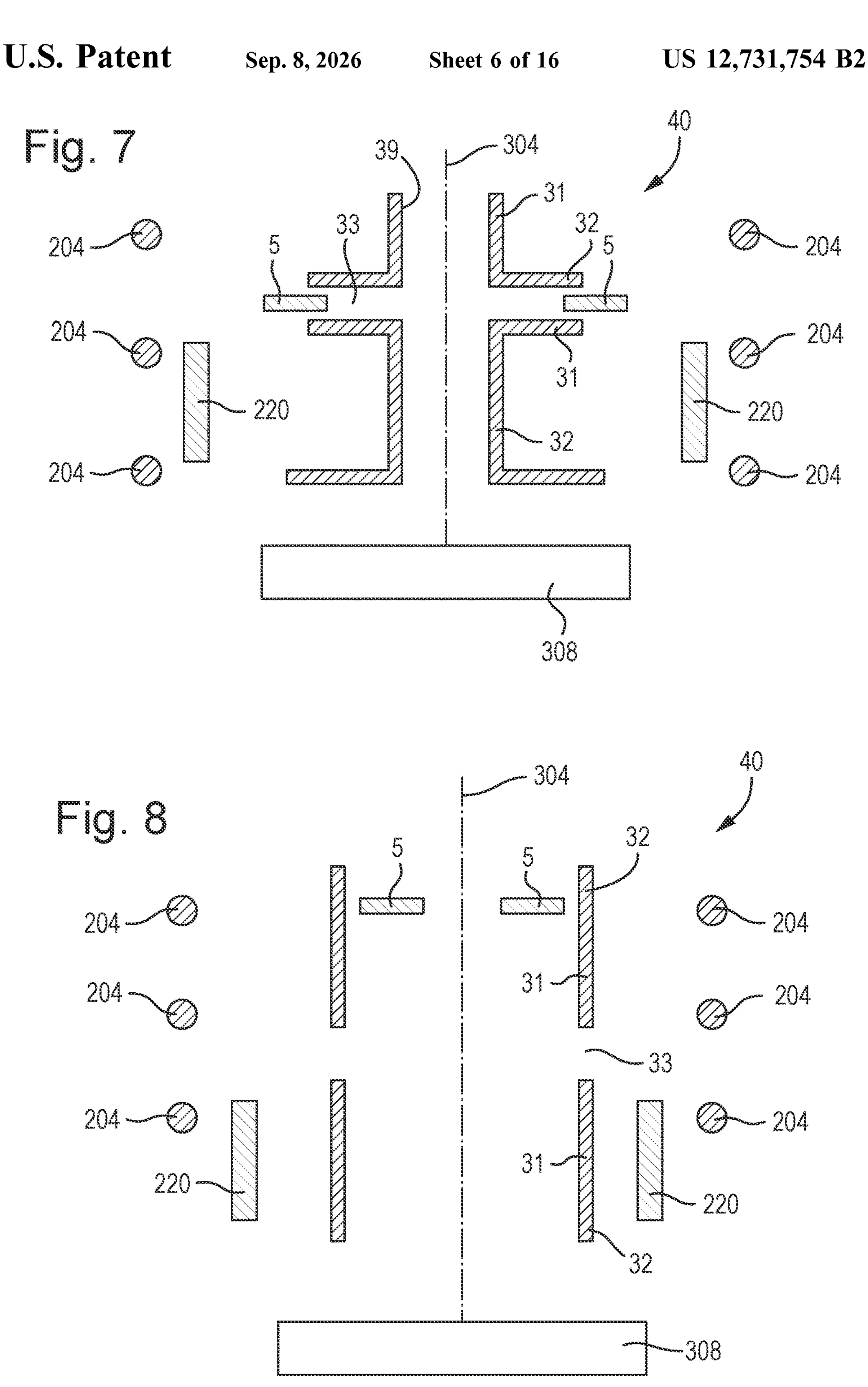
FIG. 7 is a schematic diagram of an electron-optical assembly according to some embodiments of the present disclosure.
FIG. 8 is a schematic diagram of an electron-optical assembly according to some embodiments of the present disclosure.

FIG. 7 schematically depicts part of an electron-optical column 40 according to some embodiments. FIG. 7 schematically illustrates the radial position of the electromagnetic shielding 31 relative to other components of the electron-optical column 40. A surface of the target 308, or if beyond the outer perimeter of the target 308 then a surface of the target support, may extend away from the beam path. In some embodiments, the surface of the target and/or the target support may extend away from the beam path at least as far as the facing surface 34 of the final section 32.

As shown in FIG. 7, the electron-optical column 40 comprises a thermal conditioner 204. The thermal conditioner 204 is configured to thermally condition at least a portion of the electron-optical column 40. In some embodiments, the thermal conditioner 204 comprises a plurality of thermal conditioning channels. The channels may contain conditioning fluid configured to exchange heat with one or more other portions of the electron-optical column 40. In some embodiments, the thermal conditioner 204 is configured to remove heat generated within the electron-optical column. Alternatively, the thermal conditioner 204 may have a mode in which it can provide heat to the electron-optical column 40. In some embodiments, the thermal conditioner 204 is configured to transport heat to a different part of the inspection tool 100. In some embodiments, the thermal conditioner is configured to thermally conditioning a part of the electron-optical column 40 so that it is maintained at a stable temperature.

As shown in FIG. 7, the electromagnetic shielding 31 is radially inward of the thermal conditioner 204. The electromagnetic shielding 31 is configured to shield the beam from electromagnetic fields including those generated by the thermal conditioner 204.

As shown in FIG. 7, the electron-optical column 40 comprises at least one pump 220. The pump 220 is configured to control the pressure within the electron-optical column 40. In some embodiments, the pump 220 is connectable, for example a pumping unit of the pump 220, to an under pressure so as to reduce the pressure in the electron-optical column 40, for example to generate and maintain a vacuum in which the column 40 is positioned. In some embodiments, the pump 220, for example a venting valve of the pump 220, is connectable to an over pressure so as to increase the pressure in which the electron-optical column 40 is located.

As shown in FIG. 7, the electromagnetic shielding 31, in reference to the beam path, is radially inward of the pump 220. The electromagnetic shielding 31 is configured to shield the beam from electromagnetic fields generated by the pump 220.

As shown in FIG. 7, the electron-optical column 40 comprises an electron optical element such as a collimator 5. The collimator 5 is configured at least partially to collimate the charged particle beam. Under operation of the collimator 5, the path of the beam may be in the direction of the idealised beam path, or at least the beam path at least diverging less or even converging. In some embodiments, the electron-optical column 40 comprises an electron-optical element such as a deflector. The deflector may be configured to deflect the charged particle beam.

As shown in FIG. 7, the inner surface 39 of the electromagnetic shielding 31 is radially inward of the electron-optical element such as the collimator 5. The collimator 5 acts on the beam. The collimator 5 is positioned such that the electromagnetic fields that it generates influence the beam on the beam path. The collimator 5 is positioned between two adjoining sections 32 of the electromagnetic shielding 31.

In the arrangement shown in FIG. 7, the collimator 5 is radially outward of the radially inner surface 39 of the electromagnetic shielding 31. In an alternative example, part of the collimator 5 (e.g. a radially inner edge of the collimator 5) is at the same radial position as the radially inner surface 39 of at least one of the sections 32 immediately up-beam or down-beam. Locating the collimator 5 at the same distance as the inner surface 39 of an adjoining section relative to the beam path, or close to the distance of the inner surface 39, helps to reduce the possibility that the electromagnetic shielding 31 undesirably attenuates the effect of the collimator 5 on the beam.

FIG. 8 schematically depicts part of an electron-optical column 40 according to some embodiments. FIG. 8 schematically illustrates an alternative radial position of the electromagnetic shielding 31 relative to other components of the electron-optical column 40.

As shown in FIG. 8, the electromagnetic shielding 31 is radially inward of the thermal conditioner 204 and the pump 220. The electromagnetic shielding 31 is radially outward of the electron-optical element such as the collimator 5. As shown in FIG. 8, a gap 33 between adjoining sections 32 permits fluid connection between the pump 220 and the volume close to, and even including, the electron-optical axis 304 within the electromagnetic shielding 31. As illustrated in FIGS. 7 and 8, by providing that the pump 220 is outside of the electromagnetic shielding 31, there is greater design freedom for the pump 220 because the electron-optical properties (e.g. voltage, currents) are shielded from the beam. By providing that the pump 220 is outside of the electromagnetic shielding 31, the pump 220 may not be required to meet such high electron-optical requirements, thereby increasing design freedom. By providing that the pump 220 is distanced from the electromagnetic shielding 31, the risk of vibrations being transmitted from the pump 220 to the column 40 may be reduced. Such vibrations can have a negative impact on the performance of the electron-optical column 40.

As the electromagnetic device is within the shielding 31 and the device has a power supply from outside the shielding 31, the routing to the device is designed to minimise generating electromagnetic fields within the shielding 31. For example, as two routing connections are required to be connected to an electrode of the electromagnetic device (in order to complete an electrical circuit), the routings are placed adjacent to each other so that the electromagnetic fields generated by the routings substantially cancel each other out. Thus, if the electromagnetic device is an array, the routing to each electrode for each opening in the array is designed such that the routing is positioned with its opposing routing so any generated electromagnetic filed is substantially mutually cancelled.

Figure 9:
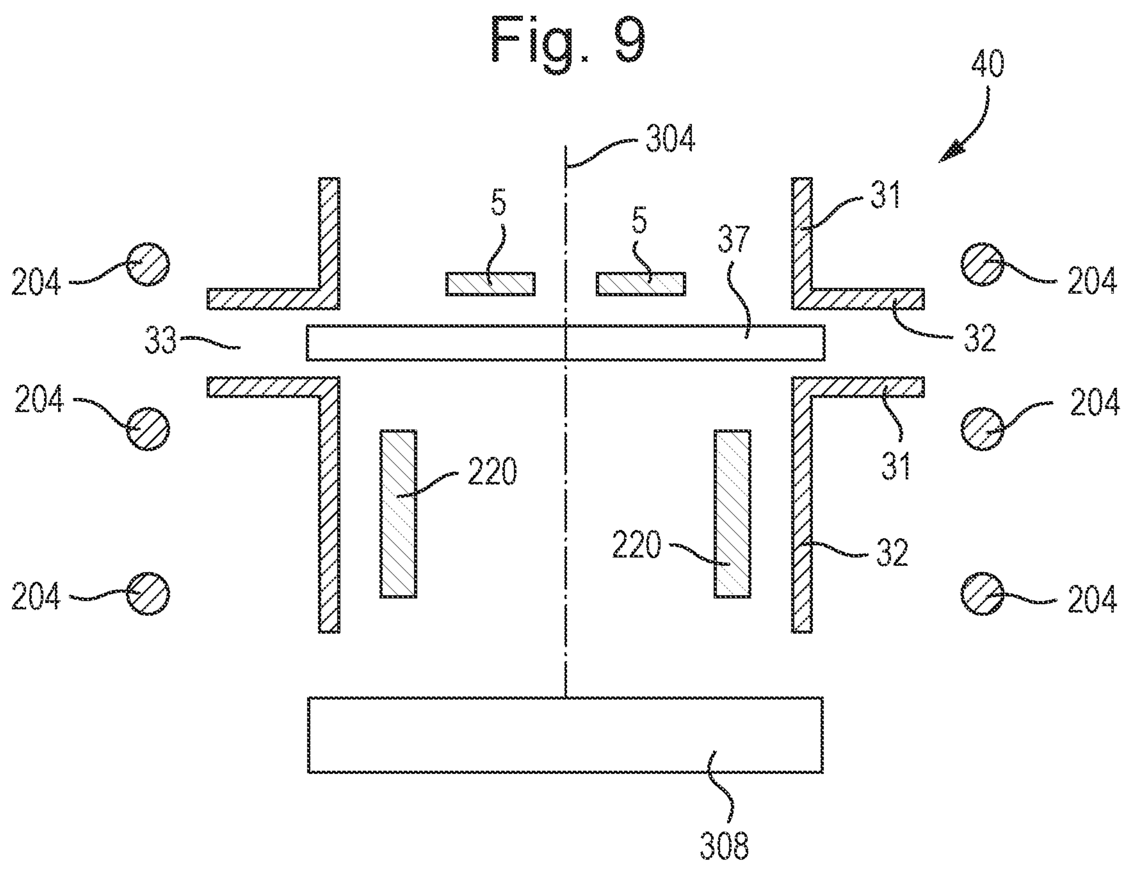
FIG. 9 is a schematic diagram of an electron-optical assembly according to some embodiments of the present disclosure.

FIG. 9 schematically depicts part of an electron-optical column 40 according to some embodiments. FIG. 9 schematically illustrates an alternative radial position of the electromagnetic shielding 31 relative to other components of the electron-optical column 40.

As shown in FIG. 9, the electromagnetic shielding 31 is radially inward of the thermal conditioner 204. The electromagnetic shielding 31 is radially outward of the pump 220 and the electron-optical element such as the collimator 5. By providing that the pump 220 is radially inward of the electromagnetic shielding 31, the vacuum around the beam can be improved.

Figure 10:
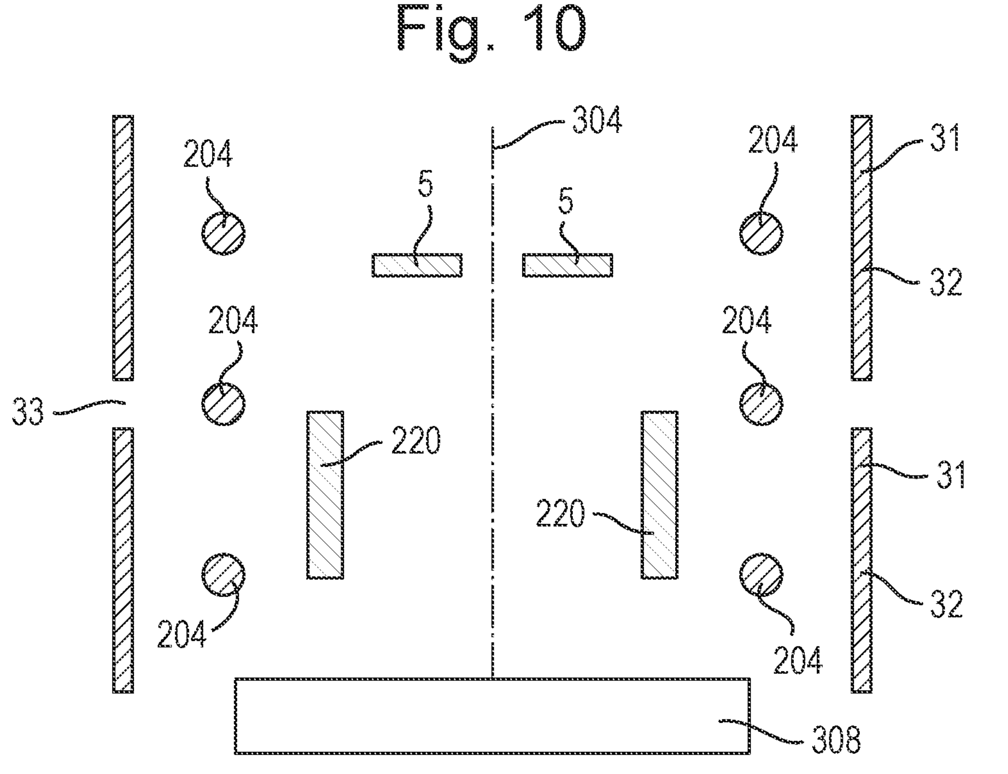
FIG. 10 is a schematic diagram of an electron-optical assembly according to some embodiments of the present disclosure.

As shown in FIG. 9, a lens or an array of lenses 37 is provided between adjacent sections 32. Other types of electron-optical elements may be positioned between adjacent sections 32. In some embodiments, the electron-optical element between the sections 32 is a MEMS element. For example, the deflectors 36 and/or lenses 37 may be MEMS. The lens 37 may be positioned in a gap 33 between adjacent sections 32. In an arrangement there may be a plurality of manipulators between the adjoining sections 32. The plurality of manipulators may include multiples of the same type of manipulator, such as lens, deflector or stigmator, and/or may include different types of manipulator such as a lens, a deflector and/or a corrector. The different manipulators may include an array of elements. A corrector array may be provided comprising a plurality of correctors. A collimator array may be provided comprising a plurality of collimators, FIG. 10 schematically depicts part of an electron-optical column 40 according to some embodiments. FIG. 10 schematically illustrates an alternative radial position of the electromagnetic shielding 31 relative to other components of the electron-optical column 40.

As shown in FIG. 10, the electromagnetic shielding 31 is radially outward of the thermal conditioner 204, the pump 220 and the electron-optical element such as the collimator 5. A variation of this arrangement may have the pump 220 external to the shielding 31. The different arrangements of manipulator as described in FIG. 9 may apply to these arrangements.

Figure 11:
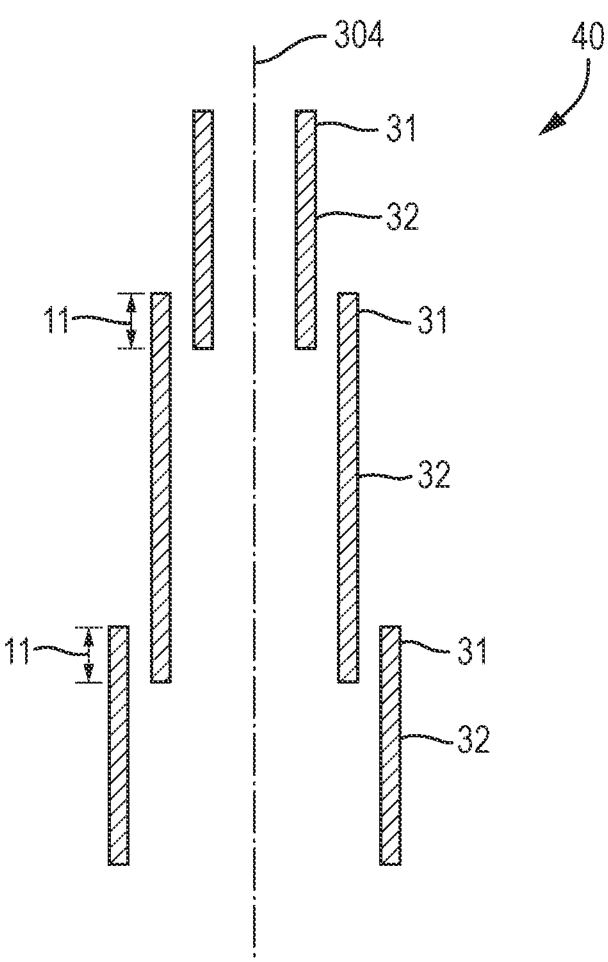
FIG. 11 is a schematic diagram of an electron-optical assembly according to some embodiments of the present disclosure.

FIG. 11 depicts an electron-optical assembly as part of an electron-optical column 40 according to some embodiments. As shown in FIG. 11, at least two of the sections 32 comprise adjoining ends which electromagnetically engage with each other. In an arrangement the electromagnetic engagement between adjoining sections 32 is contactless. There may be a gap between the proximate surfaces of adjoining sections 32. The sections 32 combine to shield the beam from stray electromagnetic fields. The sections 32 engage electromagnetically such that stray electromagnetic fields cannot influence the beam within the shielding 31.

As shown in FIG. 11, the adjoining ends are dimensioned to be coaxially arranged. Alternatively, the sections 32 may not be coaxial if, for example, it is required for the electromagnetic shielding 31 to fit into a specifically shaped space within the electron-optical column 40. The shielding is not necessarily required to be symmetrically arranged around the beam path.

As shown in FIG. 11, the adjoining ends are dimensioned so that one end is insertable within the other. In some embodiments, the adjoining sections 32 overlap along the beam path. As shown in FIG. 11, an overlap 11 may be formed between adjacent sections 32 in the direction of the beam path. The overlap ensures that external electromagnetic fields do not undesirably influence, such as divert, the beam from the beam path.

In some embodiments, the adjoining ends of the adjacent sections 32 are physically separate from each other. In some embodiments, the adjoining ends are electromagnetically engaged with each other. The sections 32 are moveable in the direction of the beam path. The sections 32 can be removed or replaced one-by-one so as to maintain parts of the electron-optical column 40.

In an arrangement the electromagnetic shielding 31 comprises different types of sections 32, for example a section with a gap between adjoining sections and a section which coaxially engages with an adjoining section. In such an arrangement the shielding 31 may comprise a section in a module which may be removable from the electron-optical column 40. In such an arrangement a section may be adapted at one end to coaxially engage with an adjoining section and at its other end have a facing surface to face a facing surface of the adjoining section.

In some embodiments, the electromagnetic shielding 31 described in this document can be applied to tools featuring one or more MEMS electron-optical elements such as a MEMS objective lens.

As described above, in some embodiments, the electron-optical column 40 may comprise alternative and/or additional components on the charged particle path, such as lenses and other components some of which have been described earlier with reference to FIGS. 1 and 2. In particular, embodiments include an electron-optical column 40 that generates a plurality of sub-beams from a charged particle beam from a source. In some embodiments, the electromagnetic shielding 31 is configured to surround all of the sub-beams at a given position in the electron-optical column 40. In an alternative example each sub-beam is provided with respective surrounding electromagnetic shielding 31. In some embodiments, a group of sub-beams of the multi-beam are provided with electromagnetic shielding 31, preferably with a series of sections 32. In some embodiments, the sub-beams of the multi-beam are assigned a group so that multi-beam is comprised of groups of sub-beams. The groups of sub-beams may have designed shielding 31 comprised of a series of sections along and around the paths of the sub-beams of the respective group.

In some embodiments, the electromagnetic shielding 31 has a circular cross section. Alternatively, the cross-sectional shape may be rectangular or square or rectangular with rounded corners or square with rounded corners.

In FIGS. 3 to 5, for example, the inner diameter is the same for all of the sections 32. Alternatively, the inner diameter may vary for the different sections. This may help to reduce the volume of the electromagnetic shielding 31.

In some embodiments, the sections 32 are concentrically aligned along the beam path. In an alternative embodiment, one or more of the sections 32 may be offset with respect to each other. This can result in a magnetic lensing action on the beam.

In some embodiments, separate electrostatic shielding and magnetic shielding are provided. The electrostatic shielding is configured to shield the beam from electrostatic fields. The magnetic shielding is configured to shield the beam from magnetic fields. The electrostatic shielding may have features as described above for the electromagnetic shielding 31. The magnetic shielding may have features as described above for the electromagnetic shielding 31. In some embodiments, the magnetic shielding is radially outward of the electrostatic shielding. Alternatively, the magnetic shielding may be radially inward of the electrostatic shielding. In a further arrangement the magnetic and electric shielding may be combined in one set of shielding.

As described above, in some embodiments, a secondary column (not shown) is provided comprising detection elements for detecting corresponding secondary charged particle beams. In some embodiments, the electron-optical assembly comprising the electromagnetic shielding may be provided as part of the secondary column. For example, the source and/or detector of the secondary column may be provided with the electromagnetic shielding described above except as specified here. The shielding need not extend up-beam of the source. The shielding need not extend down-beam of the detector. In some embodiments, a Wien filter is accommodated by the shielding 31 with a Y-shaped section. The Y-shaped section may comprise a plurality of sections, which may simplify manufacture and assembly. In some embodiments, the sections have flanges as described above. In some embodiments, the sections are field replaceable. In an alternative example the flanges can be used to bolt sections to a frame or together.

Figure 12:
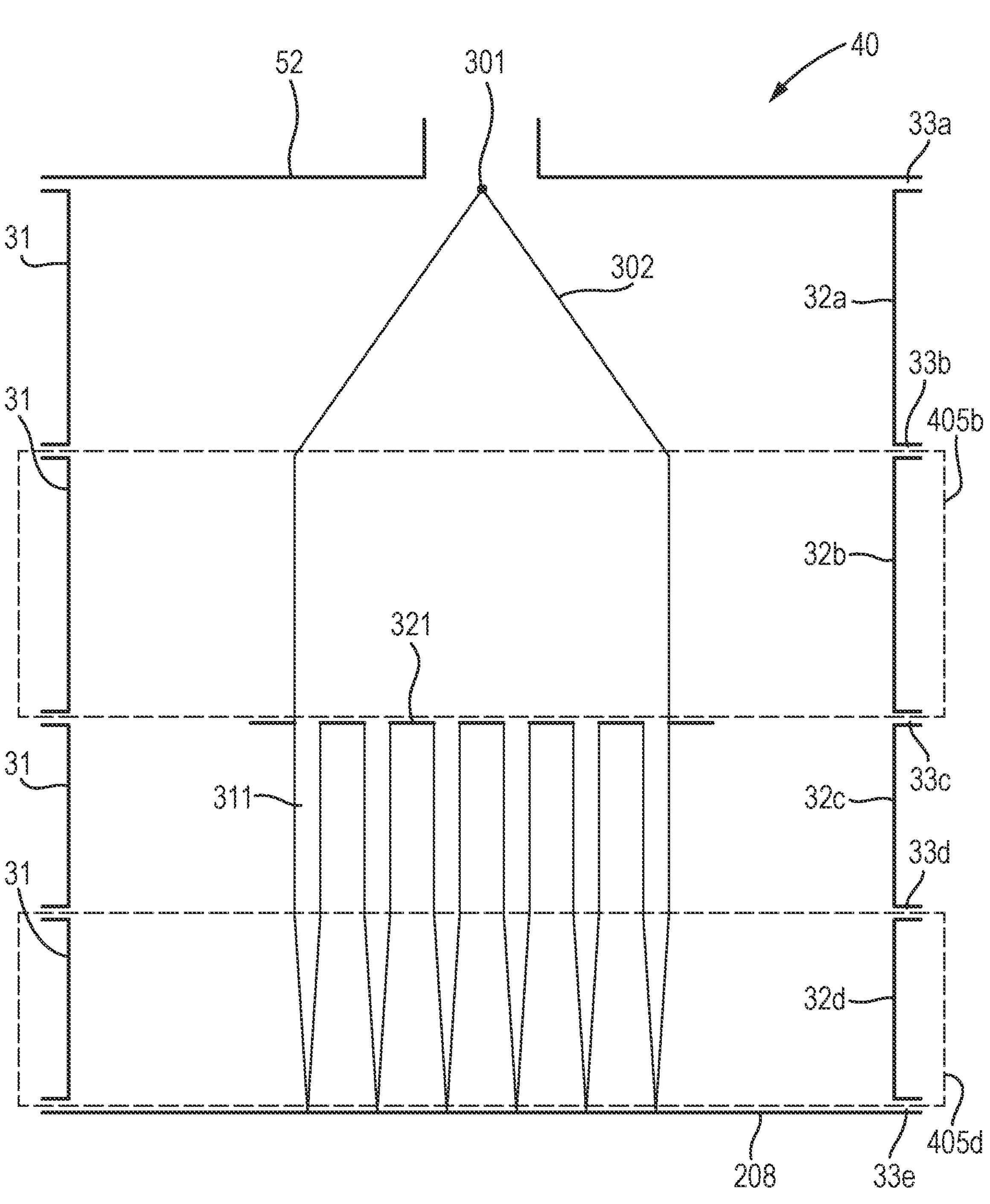
FIG. 12 is a schematic diagram of an electron-optical column according to some embodiments of the present disclosure.

FIG. 12 is a schematic diagram of an electron-optical column 4 according to some embodiments. As shown in FIG. 12, a plurality of sections 32*a-d* of the electromagnetic shielding 31 are provided. The sections 32*a-d* are provided at different positions along the direction parallel to the beam path. The different sections 32*a-d* correspond to different parts of the electron-optical column 40.

For example, a first section 32*a* corresponds to the source part of the electron-optical column 40. The source part of the electron-optical column 40 extends from the source 301. The source 301 is configured to generate the primary beam 302 of charged particles. As shown in FIG. 12, the cross-sectional area of the primary beam 302 increases until the primary beam 302 is collimated. In some embodiments, the first section 32*a* extends in the direction parallel to the beam path up to where the primary beam 302 is collimated. In some embodiments, the first section 32*a* radially surrounds the source 301. Alternatively, the up-beam end of the first section 32*a* is down-beam of the source 301. The down-beam end of the first section 32*a* is up-beam of the collimator that is configured to collimate the primary beam 302.

In some embodiments, a second section 32*b* corresponds to a collimator part of the electron-optical column 40. The collimator part of the electron-optical column 40 extends from the collimator. In some embodiments, the collimator comprises a condenser lens 310 (e.g. as shown in FIG. 2). In some embodiments, the condenser lens 310 is magnetic. As shown in FIG. 12, the cross-sectional area of the collimated beam may remain substantially constant down-beam of the collimator until the primary beam 302 is divided into sub-beams 311. In some embodiments, the second section 32*b* extends in the direction parallel to the beam path up to where the primary beam 302 is divided. In some embodiments, the up-beam end of the second section 32*b* is up-beam of the collimator. The second section 32*b* may radially surround the collimator. Alternatively, the up-beam end of the second section 32*b* may be down-beam of the collimator. The down-beam end of the second section 32*b* is up-beam of the beam-limiting aperture array 321 that is configured to divide the primary beam 302.

In some embodiments, a third section 32*c* corresponds to a beam-splitter part of the electron-optical column 40. The beam-splitter part of the electron-optical column 40 extends from the component that is configured to form sub-beams 311, for example the beam-limiting aperture array 321. As shown in FIG. 12, six sub-beams 311 may be formed down-beam of the beam-limiting aperture array 321. The skilled person in the art would understand that any plural number of sub-beams may be formed for example hundreds or thousands of sub-beams. The cross-sectional area of the sub-beams 311 may remain substantially constant throughout the length of the third section 32*c*. In some embodiments, the third section 32*c* extends in the direction parallel to the beam path up to where the sub-beams 311 are focused onto the target 208. In some embodiments, the up-beam end of the third section 32*c* is up-beam of the beam-limiting aperture array 321 (or other beam-splitter). The third section 32*c* may radially surround the beam-limiting aperture array 321. Alternatively, the up-beam end of the third section 32*c* may be down-beam of the beam-limiting aperture array 321. The down-beam end of the third section 32*c* is up-beam of the objective lens that is configured to focus the sub-beams 311 onto the target 208.

In some embodiments, a fourth section 32*d* corresponds to an objective lens part of the electron-optical column 40. The objective lens part of the electron-optical column 40 extends from the component that is configured to manipulate the sub-beams 311 so as to control properties of the sub-beams 311 incident on the target 208, for example an objective lens 331 (as shown in FIG. 2). As shown in FIG. 12, the sub-beams 311 are focused down-beam of the objective lens 331. The cross-sectional area of the sub-beams 311 may decrease through at least part (and optionally all) of the length of the fourth section 32*d*. In some embodiments, the fourth section 32*d* extends in the direction parallel to the beam path up to where the sub-beams 311 are incident onto the target 208. In some embodiments, the up-beam end of the fourth section 32*d* is up-beam of the objective lens 331 (or other manipulator). The fourth section 32*d* may surround, e.g. radially, the objective lens 331. Alternatively, the up-beam end of the fourth section 32*d* may be down-beam of the objective lens 331. The down-beam end of the fourth section 32*d* is up-beam of the target 208.

In each of the parts of the electron-optical column 40, the beam of charged particles is shielded from external fields by the sections 32*a-d* of the electromagnetic shielding 31. Although four parts with four corresponding sections 32*a-d* are shown in the arrangement of FIG. 12, there may be a different number of sections 32. For example, the length of the beam may be divided into two, three or five or more parts with corresponding sections 32 of electromagnetic shielding 31. In an arrangement a shielding section may extend between the beam-limiting aperture array to down-beam of the objective lens array.

As explained above, the sections 32 are non-overlapping in the direction parallel to the beam path. In some embodiments, the electron-optical column 40 is arranged such that at least one of the parts can be replaced without the need to handle or move the other parts. As described above in relation to FIG. 3 and FIG. 4, the sections 32 are flared at their ends facing the gaps 33 between adjacent section 32. By providing the flared ends, the diminished shielding effect caused by the gaps 33 may be reduced.

In some embodiments, at least one of the sections 32*a-d* radially surrounds at least one component selected from the group consisting of a charged particle source 301, a condenser lens 310, a collimator, a source converter 320, a deflector array 323, an aperture array 321, an aberration compensator array 324, an image-forming element array 322, an objective lens 331 or objective lens array and a detector array. In some embodiments, the component is a MEMS component.

In some embodiments, at least one of the sections 32*a-d* is arranged such it is moveable together with the component that it surrounds in a direction radial to the beam path independently of another of the sections 32*a-d*. For example, as shown in FIG. 12, the electron-optical column 40 comprises a collimator module 405*b*. In some embodiments, the collimator module 405*b* comprises the second section 32*b* and the collimator. In some embodiments, the second section 32*b* and the collimator have fixed positions relative to each other. The second section 32*b* is field replaceable together with the collimator. As shown in FIG. 12, the electron-optical column 40 comprises an objective lens module 405*d*. In some embodiments, the objective lens module 405*d* comprises the fourth section 32*d* and the objective lens 331 (or objective lens array). In some embodiments, the fourth section 32*d* and the objective lens have fixed positions relative to each other. The fourth section 32*d* is field replaceable together with the objective lens.

Although not shown in FIG. 12, the electron-optical column 40 comprises a source module and/or a beam-splitter module corresponding to the source part and the beam-splitter part mentioned above, respectively.

In some embodiments, each module 405 is field replaceable. In some embodiments, each module 405 is slidable out from the electron-optical column 40 and a replacement module is slidable into the electron-optical column 40. The sliding may be in a direction perpendicular to the beam path, for example sideways in the orientation shown in FIG. 12.

By providing that the modules 405 can be replaced, it is expected to make it easier and/or cheaper to maintain the electron-optical column. At least some embodiments are expected to reduce the time and/or effort of undoing and redoing in order to replace one or more components of the electron-optical column 40.

As shown in FIG. 12, the electron-optical column 40 comprises a chimney member 52. In some embodiments, the chimney member 52 comprises the same material as the sections 32 of electromagnetic shielding 31. The chimney member 52 is configured to protect the beam path. For example, the chimney member 52 may electromagnetically shield the beam path. As shown in FIG. 12, the chimney member 52 comprises a hole, for example defined in planar or plate, through which control wires may extend. The control wires may be for controlling electron-optical components of the electron-optical column 40. The surface of the plate defining the hole may be flared.

As shown in FIG. 12, intentional gaps 33*b-d* are provided between adjacent sections 32*a-d*. In some embodiments, gaps 33*a*, 33*e* are provided at either end of the shielding 31. In some embodiments, a first gap 33*a* is provided between the chimney member 52 and the first section 32*a*. In some embodiments, a second gap 33*b* is provided between the first section 32*a* and the second section 33*b*. In some embodiments, a third gap 33*c* is provided between the second section 32*b* and the third section 33*c*. In some embodiments, a fourth gap 33*d* is provided between the third section 32*c* and the fourth section 33*d*. In some embodiments, a fifth gap 33*e* is provided between the fourth section 32*d* and the target 208. At least some embodiments are expected to achieve easier replacement of one or more components of the electron-optical column 40. At least some embodiments are expected to reduce the amount of movement of parts required in order for one or more components to be replaced. The gaps 33 can facilitate movement of a module 405 relative to other components of the electron-optical column 40.

As shown in FIG. 12, an intentional gap 33*e* is provided adjacent to the target 208. At least some embodiments are expected to reduce the possibility of the electromagnetic shielding 31 undesirably contacting the target 208. The presence of the fourth gap 33*d* between the third section 32*c* and the fourth section 32*d* allows the shielding sections 32*c*, 32*d* to be made nominally shorter. At least some embodiments are expected to reduce the sections 32*c*, 32*d* from getting jammed at assembly.

Figure 13:
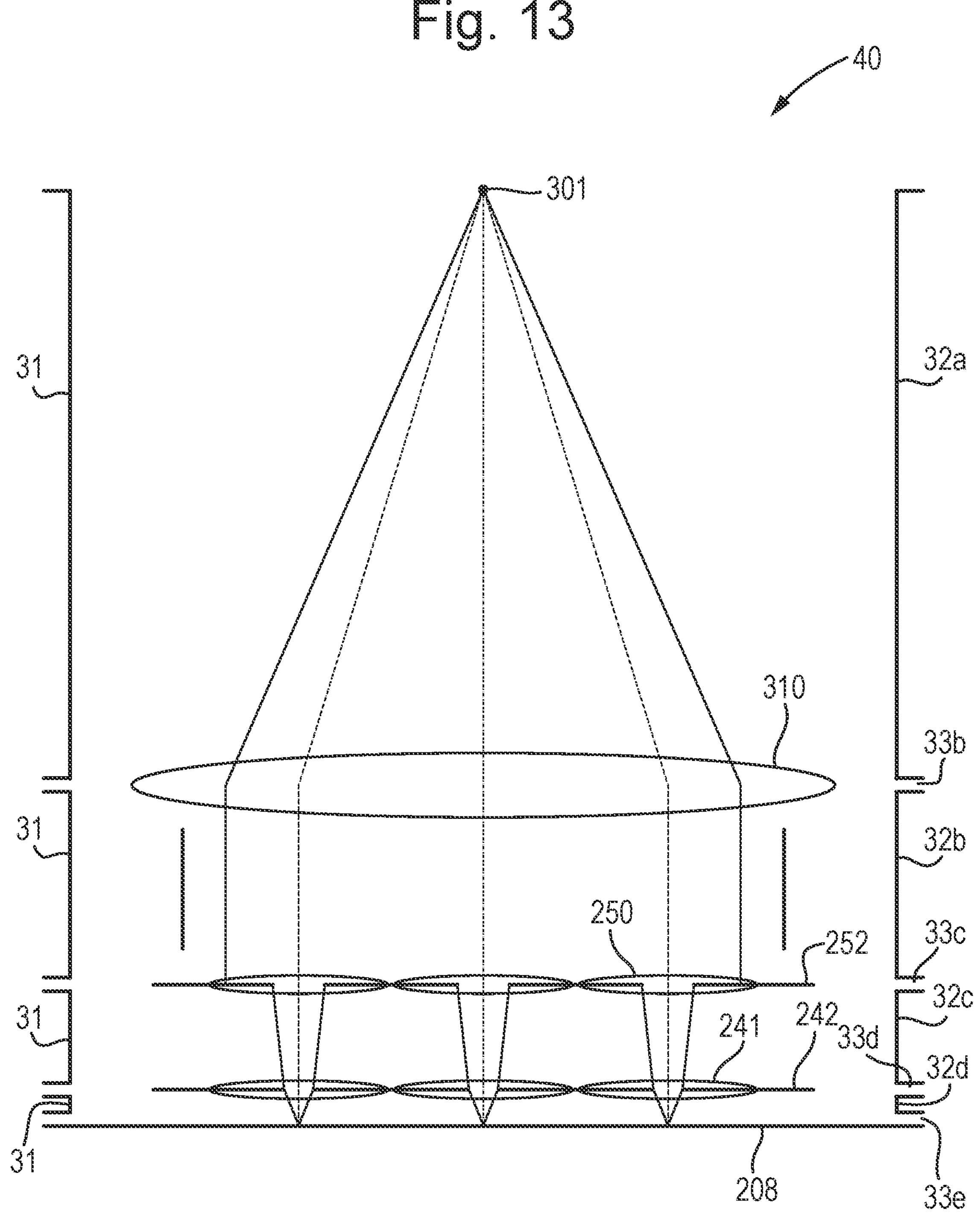
FIG. 13 is a schematic diagram of an electron-optical column according to some embodiments of the present disclosure.

FIG. 13 is a schematic view of an electron-optical column 40 according to some embodiments of the present disclosure. A description of features that are the same as described above in relation to FIG. 12 is omitted for brevity. As shown in FIG. 13, in some embodiments, four sections 32*a-d* of electromagnetic shielding 31 are provided. The four sections 32*a-d* are for different parts of the electron-optical column 40. A first section 32*a* is provided for the source part where the source 301 is provided. A second section 32*b* is provided for the collimator part where the beam is collimated by a collimator, for example a condenser lens 310. A third section 32*c* is provided for a beam-splitter part where the beam is split. For example, in the example shown in FIG. 13, The electron-optical column 40 comprises an upper beam limiter 252. The upper beam limiter 252 defines an array of beam-limiting apertures. The upper beam limiter 252 may be referred to as an upper beam-limiting aperture array or up-beam beam-limiting aperture array. The upper beam limiter 252 may comprise a plate (which may be a plate-like body) having a plurality of apertures. The upper beam limiter 252 forms the sub-beams from the beam of charged particles emitted by the source 301. Portions of the beam other than those contributing to forming the sub-beams may be blocked (e.g. absorbed) by the upper beam limiter 252 so as not to interfere with the sub-beams down-beam. The upper beam limiter 252 may be referred to as a sub-beam defining aperture array.

As shown in FIG. 13, there is a control lens array 250. Such an arrangement is described in EPA 20196714.8 filed on 17 Sep. 2020 hereby incorporated by reference at least with respect to the electron optical architecture shown with respect to three different embodiments depicted in FIGS. 3, 5 and 6 of that filing. The control lens array 250 comprises a plurality of control lenses. Each control lens comprises at least two electrodes (e.g. two or three electrodes) connected to respective potential sources. The control lens array 250 may comprise two or more (e.g. three) plate electrode arrays connected to respective potential sources. The control lens array 250 is associated with an objective lens array 241 (e.g. the two arrays are positioned close to each other and/or mechanically connected to each other and/or controlled together as a unit). The control lens array 250 is positioned up-beam of the objective lens array 241. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams.

A fourth section 32*d* is provided for an objective lens part where the sub-beams are manipulated in preparation for their incidence on the target 208. An objective lens array 241 comprising a plurality of objective lenses is provided to direct the sub-beams onto the sample 208. Each objective lens comprises at least two electrodes (e.g. two or three electrodes) connected to respective potential sources. The objective lens array 241 may comprise two or more (e.g. three) plate electrode arrays connected to respective potential sources. As shown in FIG. 13, the objective lens array 241 may comprise a beam shaping limiter 242. The beam shaping limiter 242 defines an array of beam-limiting apertures. The beam shaping limiter 242 may be referred to as a lower beam limiter, lower beam-limiting aperture array or final beam-limiting aperture array. The beam shaping limiter 242 may comprise a plate (which may be a plate-like body) having a plurality of apertures. The beam shaping limiter 242 is down-beam from at least one electrode (optionally from all electrodes) of the control lens array 250. In some embodiments, the beam shaping limiter 242 is down-beam from at least one electrode (optionally from all electrodes) of the objective lens array 241.

Figure 14:
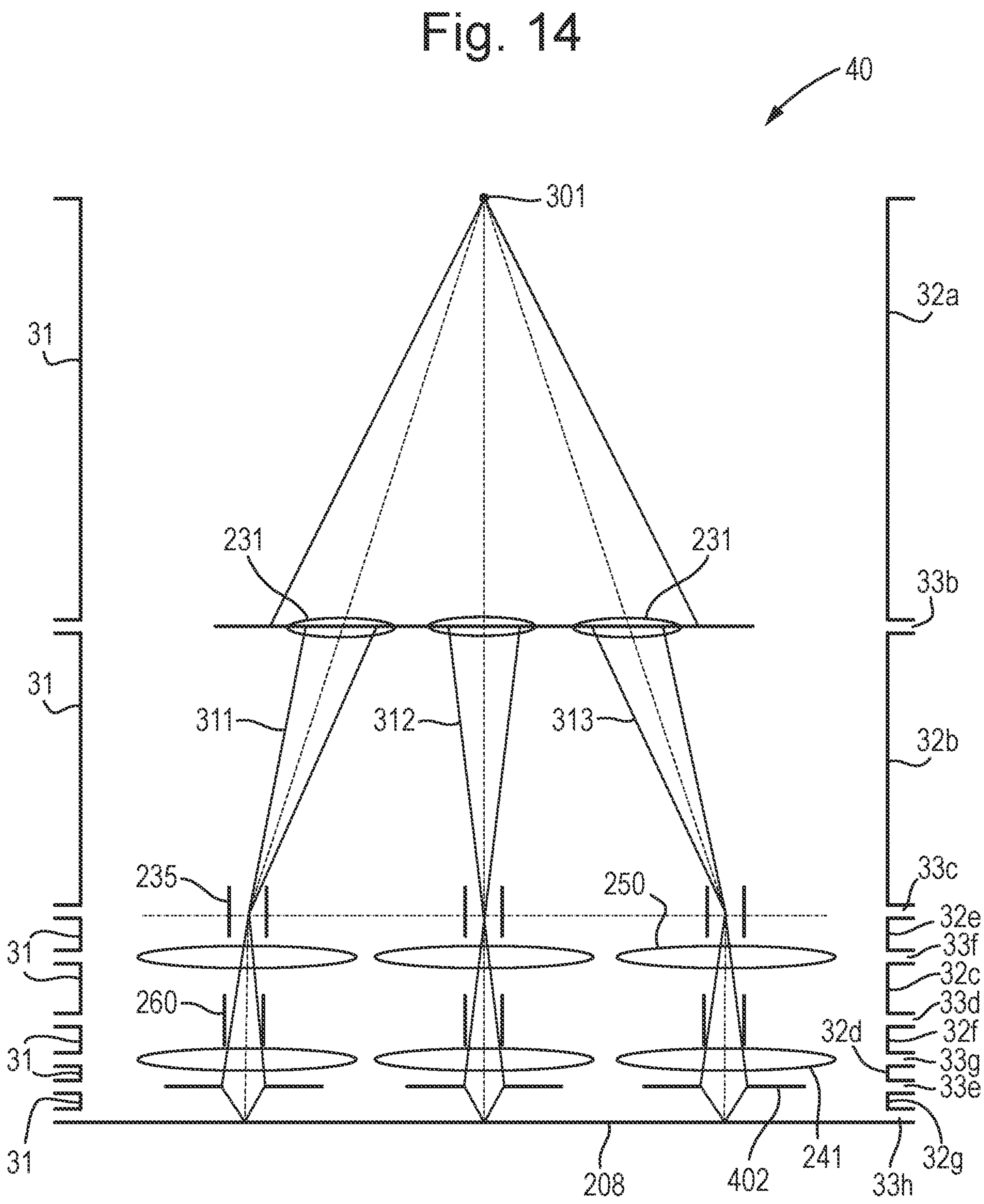
FIG. 14 is a schematic diagram of an electron-optical column according to some embodiments of the present disclosure.

FIG. 14 is a schematic view of an electron-optical column 40 according to some embodiments of the present disclosure. A description of features that are the same as described above in relation to FIG. 12 is omitted for brevity. As shown in FIG. 14, seven sections 32*a-g* of electromagnetic shielding 31 are provided. The seven sections 32*a-g* are for different parts of the electron-optical column 40. A first section 32*a* is provided for the source part where the source 301 is provided. A second section 32*b* is provided for the condenser part. As shown in FIG. 14, a condenser lens array 231 is provided between the source 301 and the control lens array 250. Such an arrangement is described in EPA 20206984.5 filed on 11 November hereby incorporated by reference at least with respect to the electron-optical architecture such as shown in FIG. 4 of that filing. The condenser lens array 231 comprises a plurality of condenser lenses. There may be many tens, many hundreds or many thousands of condenser lenses. The condenser lenses may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The second section 32*b* may surround the condenser lens array 231. The condenser lens array 231 is configured to divide the main beam into sub-beams 311-313.

A third section 32*c* is provided for a control lens array 250. A fourth section is provided for the objective lens part. For example, the fourth section 32*d* may surround the objective lens array 241, similar to the example shown in FIG. 13.

As shown in FIG. 14, a fifth section 32*e* is provided between the second section 32*b* and the third section 32*c*. The fifth section 32*e* may surround the deflectors 235. The deflectors 235 are provided at intermediate focuses. The deflectors 235 are configured to bend a respective sub-beam 311-313 by an amount effective to ensure that the principal ray is incident on the sample 208 substantially normally (i.e. at substantially 90° to the nominal surface of the sample). The deflectors 235 may also be referred to as collimators.

As shown in FIG. 14, a sixth section 32*f* is provided between the third section 32*c* and the fourth section 32*d*. The sixth section 32*f* may surround a scan-deflector array 260. The scan-deflector array 260 comprises a plurality of scan deflectors. The scan-deflector array 260 may be formed using MEMS manufacturing techniques. Each scan deflector scans a respective sub-beam over the sample 208. The scan-deflector array 260 may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally).

As shown in FIG. 14, a seventh section 32*g* is provided between the fourth section 32*d* and the target 208. The seventh section 32*g* may surround a detector module 402. The detector module 402 detects charged particles emitted from the sample 208. The detector module 402 comprises a plurality of detector elements (e.g. sensor elements such as capture electrodes). In this example, the detector module 402 is provided on an output side of the objective lens array 241. The output side is the side facing the sample 208. In variations the adjoining sections and modules may be combined. For example a section may surround an objective lens array assembly which may include the detector module 402, the objective lens array, optionally the control lens array 250, and optionally scan deflectors.

As with the embodiments described above in relation to FIG. 12 and FIG. 13, in the example shown in FIG. 14, each section 32*a*-*g* may be moved in and out of the electron-optical column 40 together with its associated component. The electron-optical column 40 is modularized. Intentional gaps 33 are provided between the sections 32*a*-*g*. This facilitates movement of the sections 32*a*-*g* relative to each other when the sections 32*a*-*g* are moved in or out of the electron-optical column 40.

Figure 15:
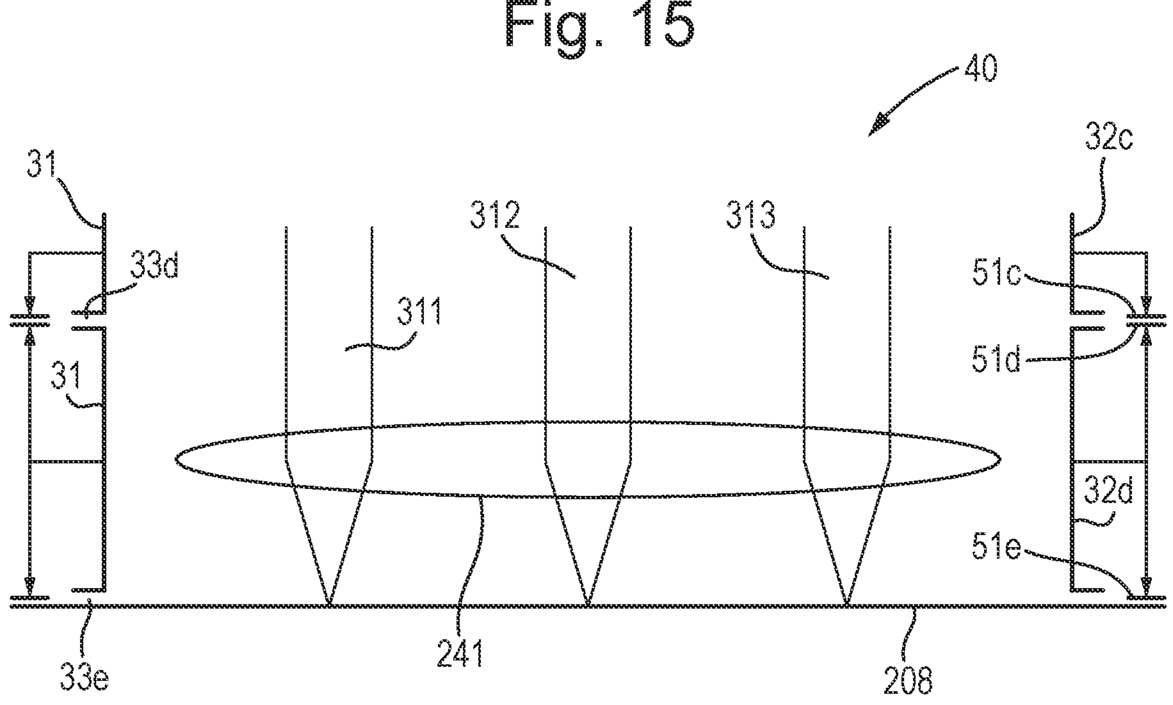
FIG. 15 is a schematic diagram of an electron-optical column according to some embodiments of the present disclosure.

FIG. 15 is a schematic view of an electron-optical column according to some embodiments of the present disclosure. As shown in FIG. 13, at least one of the sections 32 is provided with a mechanical reference member 51*c*, 51*d* configured to allow the position of the section 32 to be determined. In some embodiments, the mechanical reference member 51*c*, 51*d* is configured to allow the position of the section 32 to be determined in a direction perpendicular to the beam path. In some embodiments, the mechanical reference member 51*c*, 51*d* is configured to allow the position of the section 32 to be determined in a direction parallel to the beam path. The third section 32*c* is provided with an associated mechanical reference member 51*c*. The fourth section 32*d* is provided with associated mechanical reference members 51*d*, 51*e*. Although not shown in FIG. 15, the third section 32*c* may be provided with a further mechanical reference member for determining the position of the third section 32*c* relative to the second section 32*b*. Each section 32 may be provided with one or more mechanical reference members 51.

In some embodiments, the mechanical reference member 51 has a fixed position relative to the associated section 32 of the shielding 31. The mechanical reference member 51 may be indirectly fixed to the associated section 32 of the shielding 31. For example, the mechanical reference member 51 may be fixed to an electron-optical component that the section 32 surrounds or to a frame to which the component and the section 32 are fixed. In some embodiments, the position of the component or frame is determined by the mechanical reference member 51, and the position of the section 32 of shielding 31 follows from its position relative to the component or frame.

In some embodiments, the mechanical reference member 51*c* is configured to mechanically engage with a corresponding mechanical reference member 51*d* of another of the sections 32*d* or of the column 40. For example, the mechanical reference members 51*c*, 51*d* may comprises complementary surfaces configured to engage with each other. In some embodiments, the surfaces are flat. In an alternative embodiment, the surfaces are configured to restrict movement perpendicular to the beam path, for example by mutual engagement between adjoining sections. In some embodiments, one of the surfaces comprises a groove into which a complementarily shaped undulation of the complementary surface fits. This restricts sideways movement of the sections 32*c*, 32*d* relative to each other. In some embodiments, the surfaces are configured to restrict movement in two degrees of freedom perpendicular to the beam path. For example, one of the surfaces may comprise a depression into which a hemispherical shape of the complementary surface fits. One of the mechanical reference members 32*d* may dock into the other mechanical reference member 51*c*.

It is not essential for the mechanical reference members 51 to mechanically engage with each other. In some embodiments, the mechanical reference member 51 comprises a reflecting surface for reflecting radiation used in a distance measurement. The distance measurement may be a measurement of the vertical position of the section 32*d* relative to the target 208 or to another section 32*c*, for example. In some embodiments, an interferometric measurement is made using the mechanical reference member 51.

In some embodiments, the mechanical reference member 51 comprises a conductive material and/or a dielectric suitable for a capacitive measurement. A capacitive measurement may be made indicative of the position of the mechanical reference member 51, and thereby the position of the section 32.

In some embodiments, one or more of the section 32 are fixed in position within the column 40. In some embodiments, one or more mechanical anchoring points are configured to anchor the section 32 within the column 40. For example, a rail, a bolt and/or a preloaded spring is provided to control the position of the section 32.

Figure 16:
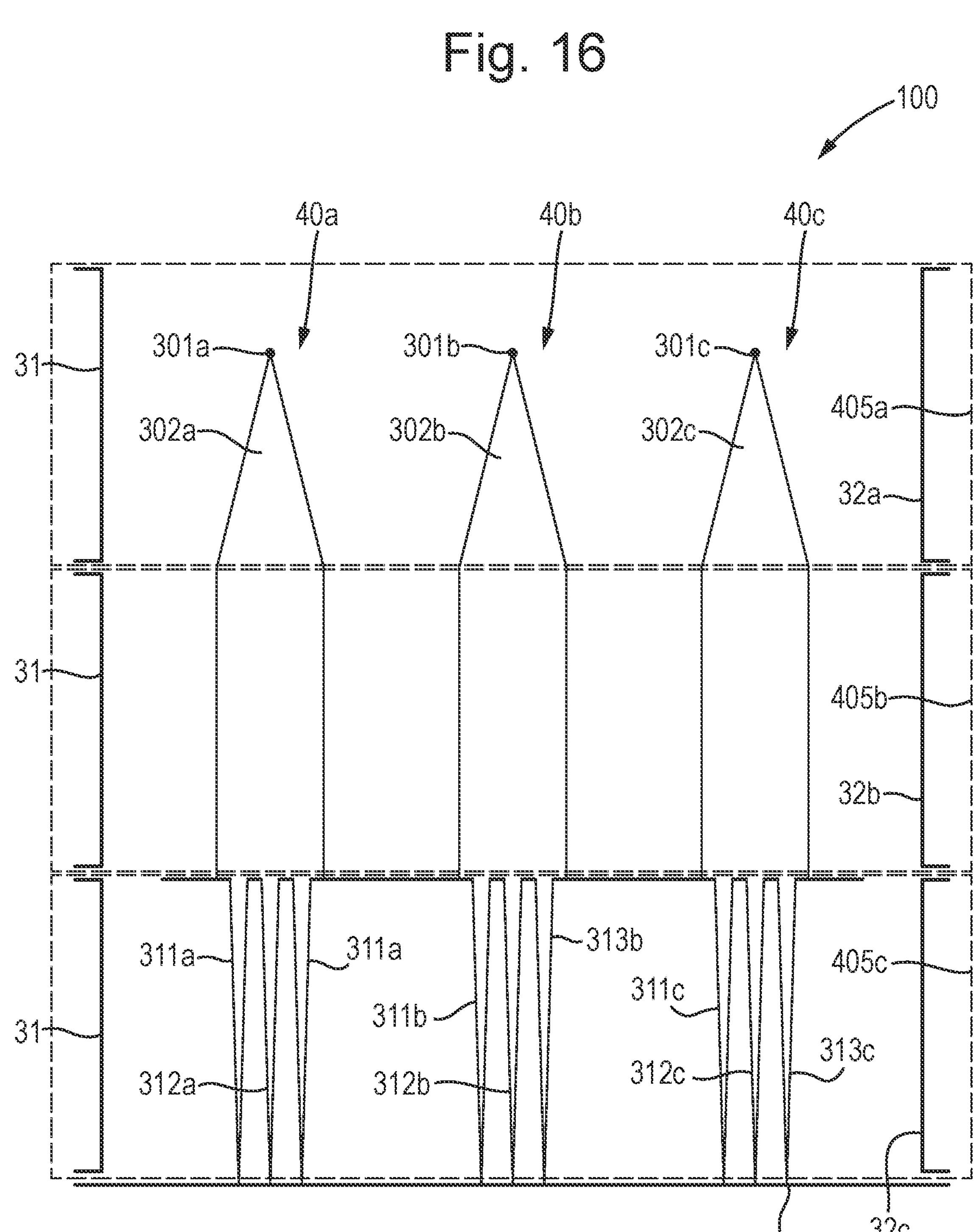
FIG. 16 is a schematic diagram of multi-column apparatus according to some embodiments of the present disclosure.

FIG. 16 is a schematic diagram of a beam inspection apparatus 100 that comprises a plurality of electron-optical columns 40. The apparatus 100 may be called a multi-column apparatus. FIG. 16 shows an example in which the apparatus 100 comprises three electron-optical columns 40*a-c*. In an alternative embodiment, the apparatus 100 comprises two, four or more electron-optical columns 40.

In some embodiments, each column 40*a-c* comprises a source 301*a-c*. Alternatively, two or more columns 40 may share a common source 301. In some embodiments, each column 40*a-c* has a main beam generated by the source 301*a-c*. The main beam is collimated, and then divided into sub-beams 311*a-c*, 312*a-c*, 313*a-c*, which are incident on the target 208.

As shown in FIG. 16, the columns 40*a-c* may be considered as separated into different parts. Each part has a corresponding section 32*a-c* of shielding 31. In some embodiments, at least one of the sections 32*a-c* radially surrounds the beam paths of two or more of the electron-optical columns 40*a-c*. For example, the first section 32*a* surrounds the source part of all three columns 40*a-c*. The source 310*a-c* is configured to generate a main beam 302*a-c* for the respective column 40*a-c*. The second section 32*b* surrounds the collimator part of all three columns 40*a-c*. The third section 32*c* surrounds the beam-splitter part of all three columns 40*a-c*. The number of different parts and corresponding sections 32 may be two, four, five, six, seven or more than seven; that is as few or as many as required.

Figure 19:
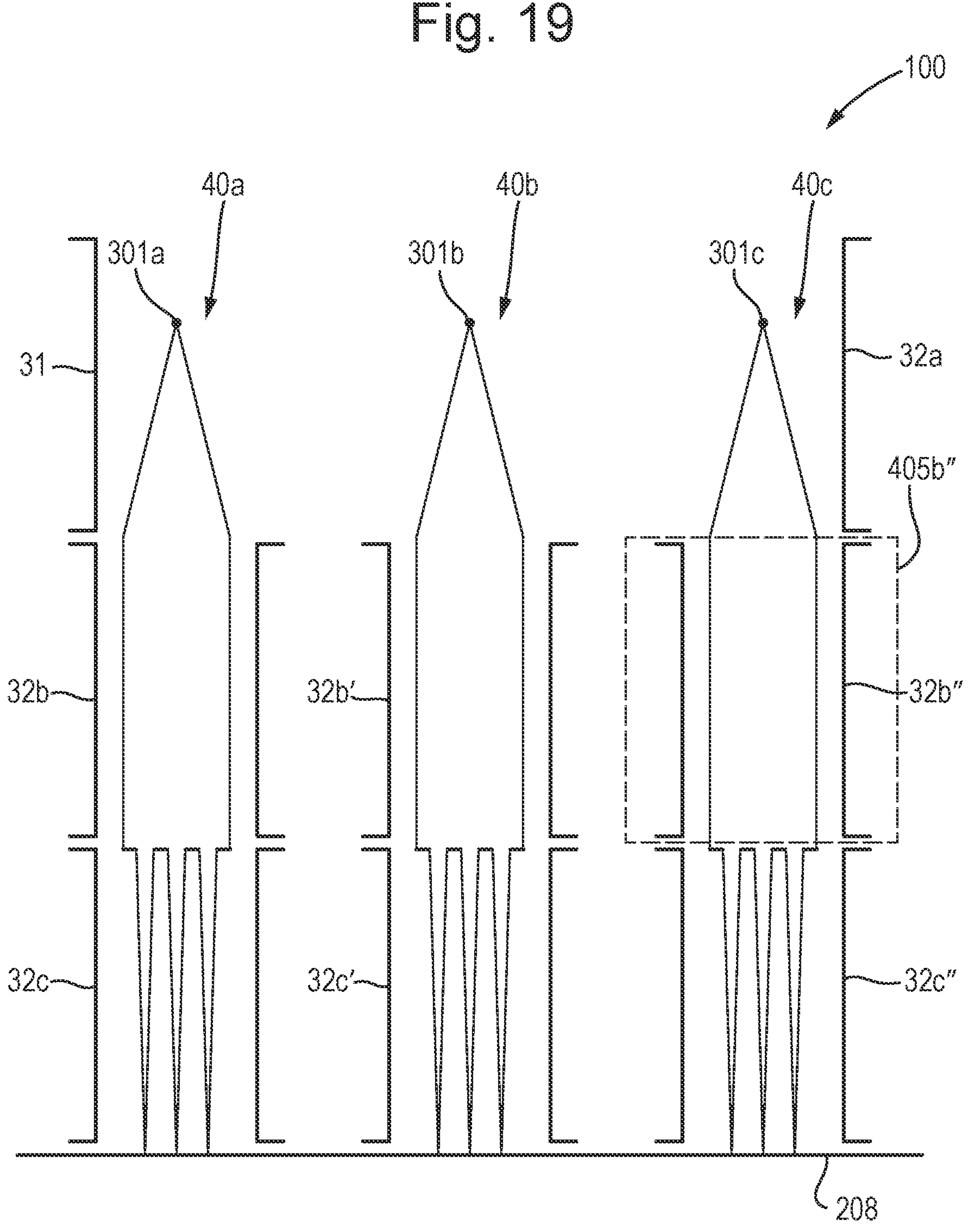
FIG. 19 is a schematic diagram of multi-column apparatus according to some embodiments of the present disclosure.

In the example shown in FIG. 16, all of the sections 32 surround the beam paths of all of the columns 40. However, this is not necessarily the case. For example, one or more sections 32 may surround the beam path of only one of the columns 40. This is illustrated in FIG. 19, for example.

As shown in FIG. 16, the apparatus 100 comprises a source module 405*a*. The source module 405*a* comprises the first section 32*a*. In some embodiments, the source module 405*a* comprises the sources 301*a-c*. The source module 405*a* is replaceable independently from the other modules 405*b*, 405*c*. In some embodiments, the apparatus 100 comprises a collimator module 405*b*. The collimator module 405*b* comprises the second section 32*b*. In some embodiments, the collimator module 405*b* comprises one or more collimators configured to collimate the main beams 302*a-c*. The collimator module 405*b* is replaceable independently from the other modules 405*a*, 405*c*. In some embodiments, the apparatus 100 comprises a beam-splitter module 405*c*. The beam-splitter module 405*c* comprises the third section 32*c*. In some embodiments, the beam-splitter module 405*c* comprises one or more beam splitters configured to split the main beams 302*a-c* into sub-beams 311-313. The beam-splitter module 405*c* is replaceable independently from the other modules 405*a*, 405*b*.

Figure 17:
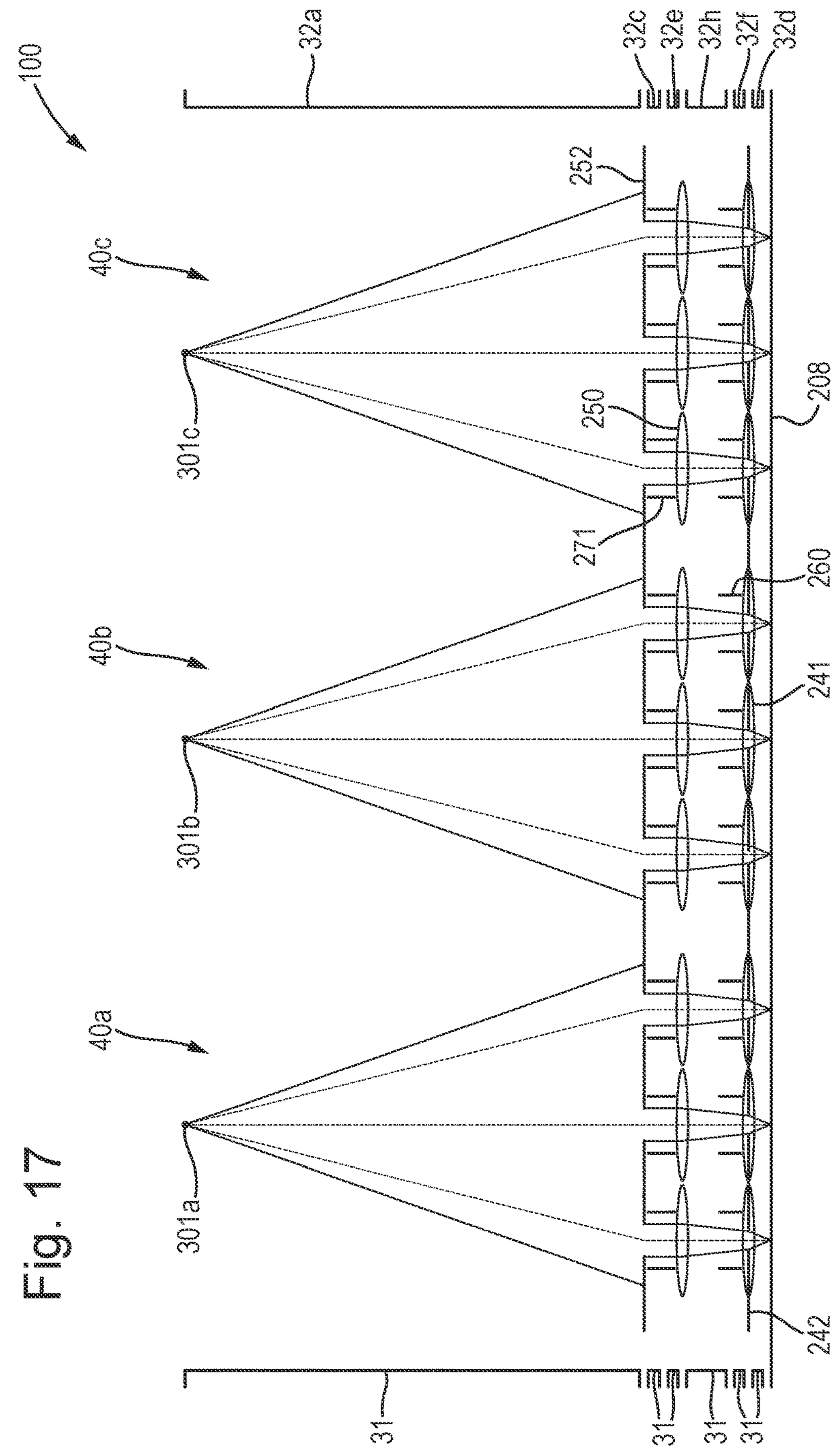
FIG. 17 is a schematic diagram of multi-column apparatus according to some embodiments of the present disclosure.

FIG. 17 is a schematic diagram of an inspection beam apparatus 100 according to some embodiments of the present disclosure. The apparatus 100 is a multi-column apparatus. FIG. 17 shows three columns 40*a-c*. In alternative embodiments, the number of columns 40 may be two, four or more than four.

As shown in FIG. 17, the apparatus comprises six sections 32 of shielding 31 for different parts of the columns 40. A first section 32*a* is provided for the source part. The first section 32*a* and the sources 301*a-c* may be combined together in a source module that is replaceable independently of other parts of the apparatus 100. A third section 32*c* is provided for the beam-splitter part. The third section 32*c* and the upper beam limiter 252 may be combined together in a beam-splitter module that is replaceable independently of other parts of the apparatus 100.

A fifth section 32*e* is provided for the collimator part in which a collimator element array 271 is provided. Each collimator element collimates a respective sub-beam. Providing the collimator element array 271 and the scan-deflector array 260 (described below) together may therefore provide space saving.

An eighth section 32*h* is provided for a control lens part of the columns 40 in which a control lens array 250 is provided. The eighth section 32*h* and the control lens array 250 may be combined together in a control lens module that is replaceable independently of other parts of the apparatus 100. Similar to the example shown in FIG. 14, a sixth section 32*f* is provided for a scan-deflector part of the columns 40. In some embodiments, the sixth section 32*f* may be combined with the scan-deflector array 260 in a scan-deflector module that is replaceable independently of other parts of the apparatus 100. Similar to the example shown in FIG. 13, a fourth section 32*d* corresponds to an objective lens part of the electron-optical columns 40. The fourth section 32*d* may be combined with the objective lens array 241 in an objective lens module that is replaceable independently of other parts of the apparatus 100.

Although FIG. 17 shows an arrangement with columns that are electrostatic equivalents to the arrangement shown in and described with respect to FIG. 13, the column may be any suitable electron-optical column such as shown in and described with respect to FIG. 14. The number of shielding sections may be adjusted to the number of different modules which require a field replaceable function.

Figure 18:
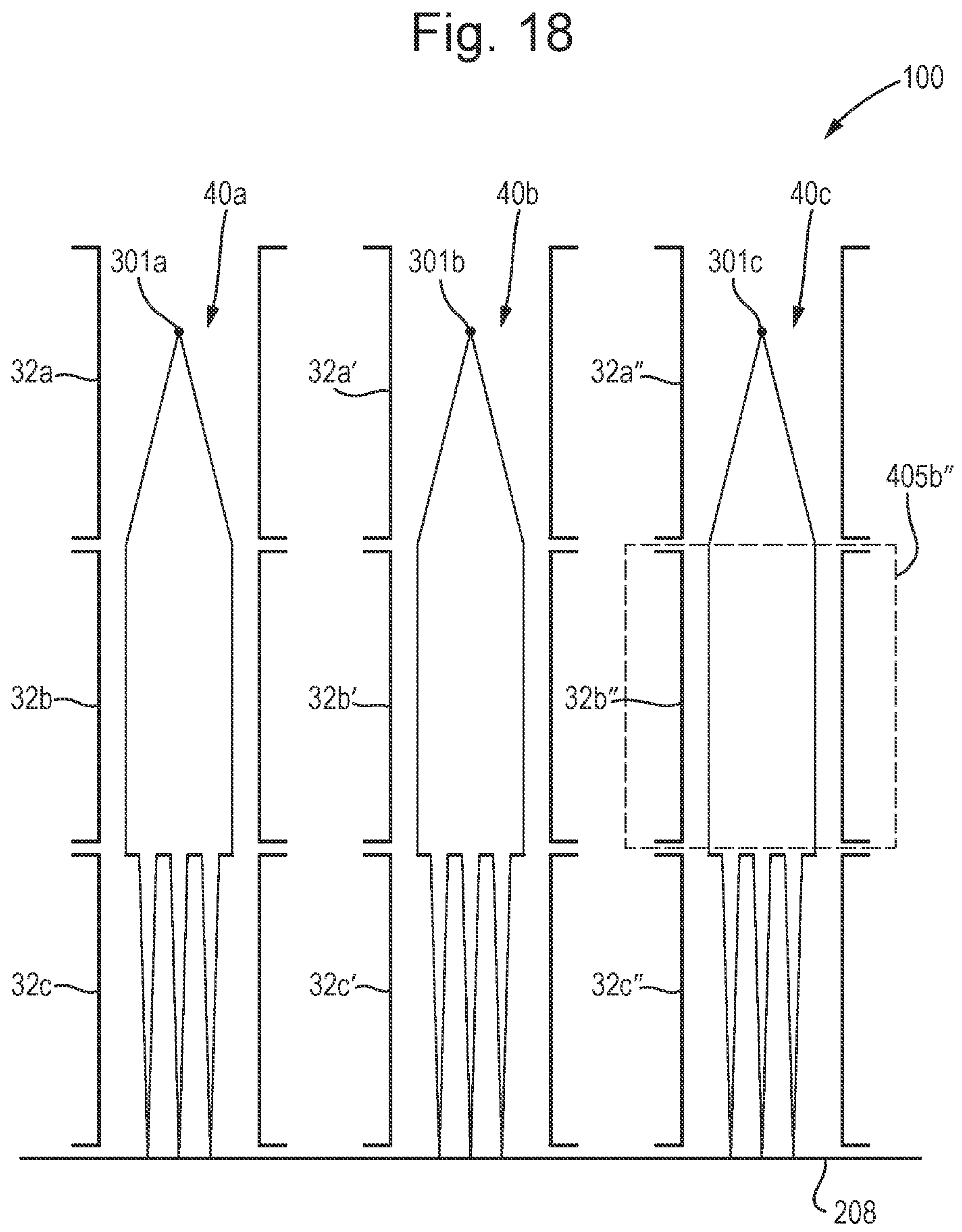
FIG. 18 is a schematic diagram of multi-column apparatus according to some embodiments of the present disclosure.

FIG. 18 is a schematic diagram of an inspection beam apparatus 100 according to some embodiments of the present disclosure. The apparatus 100 is a multi-column apparatus. FIG. 18 shows three columns 40*a-c*. In alternative embodiments, the number of columns 40 may be two, four or more than four, for example twenty or one hundred or more. A description of features that are the same as described above in relation to FIG. 16 is omitted for brevity.

In the example shown in FIG. 16, the beam paths of all of the columns 40 are radially surrounded by the sections 32. However, this is not necessarily the case. As shown in FIG. 18, the beam path of at least one of the electron-optical columns 40 is radially outside of at least one of the sections 32. For example, the beam paths of the second and third columns 40*b*, 40*c* are radially outside of the first section 32*a* provided for the first column 40*a*. In some embodiments, at least one of the sections 32 radially surrounds the beam path of only one of the electron-optical columns 40. For example, the first section 32*a* for the first column 40*a* radially surrounds the beam path of only the first column 40*a*.

As shown in FIG. 18, different sections 32 of electromagnetic shielding 31 radially surround beam paths of respective different electron-optical columns 40, the different sections 32 being at overlapping positions in a direction parallel to the beam paths. For example, as shown in FIG. 18, a second section 32*b* for the first column 40*a* radially surrounds the beam path of only the first column 40*a*. A third section 32*c* for the first column 40*a* radially surrounds the beam path of only the first column 40*a*. A first section 32*a*' for the second column 40*b* radially surrounds the beam path of only the second column 40*b*. A second section 32*b*' for the second column 40*b* radially surrounds the beam path of only the second column 40*b*. A third section 32*c*' for the second column 40*b* radially surrounds the beam path of only the second column 40*b*. A first section 32*a*" for the third column 40*c* radially surrounds the beam path of only the third column 40*c*. A second section 32*b*" for the third column 40*c* radially surrounds the beam path of only the third column 40*c*. A third section 32*c*" for the third column 40*c* radially surrounds the beam path of only the third column 40*c*.

As shown in FIG. 18, a plurality of the sections 32 at overlapping position in a direction parallel to the beam paths are arranged such that they are moveable together in a direction radial to the beam path independently of another of the sections 32. For example, all of the first sections 32*a*, 32*a*', 32*a*" are moveable together. The first sections 32*a*, 32*a*', 32*a*" may be fixed relative to each other. The first sections 32*a*, 32*a*', 32*a*" may be combined together in a combined source module that is replaceable independently of other modules of the apparatus 100.

Similar to the embodiments described above and shown in FIGS. 12-17, the sections 32 are provided for different parts of the columns 40*a-c*. The sections 32 can be replaced independently of other sections 32. The sections 32 may be combined with a corresponding component in a module that is replaceable independently of other modules. For example, as shown in FIG. 18, the second section 32*b*" for the third column 40*c* may be combined with a collimator in a collimator module 405*b*" that is replaceable independently of other modules. Although not illustrated in FIG. 18, each section 32 corresponds to a separate module of the apparatus 100. In a variation of the example shown in and described with respect to FIG. 18, groups of columns may correspond to the position of each depicted column, for example in lines across the multi-column arrangement, in a grid so that each cell of the grid may have multiple columns, or both. The section surrounding each group of column may have features and function as described with respect to and shown in FIG. 17.

FIG. 19 is a schematic diagram of an inspection beam apparatus 100 according to some embodiments of the present disclosure. The apparatus 100 is a multi-column apparatus. FIG. 19 shows three columns 40*a-c*. In alternative embodiments, the number of columns 40 may be two, four or more than four for example twenty-five or one hundred or more. A description of features that are the same as described above in relation to FIGS. 16-18 is omitted for brevity.

In the embodiments shown in FIGS. 16-17, each section 32 of shielding 31 surrounds the beam paths of multiple columns 40. In the example shown in FIG. 18, each section 32 surrounds the beam path of only one column 40. These features are combined together in the example shown in FIG. 19. As shown in FIG. 19, a single first section 32*a* is provided for the source parts of multiple columns 40*a-c*. Separate second sections 32*b*, 32*b*', 32*b*" are provided for the collimator parts of respective columns 40*a-c*. Separate third sections 32*c*, 32*c*', 32*c*" are provided for the beam-splitter parts of respective columns 40*a-c*.

In some embodiments, each section corresponds to a separate module that can be replaced independently. For example, as shown in FIG. 19, the second section 32*b*" for the third column 40*c* may be combined with a collimator in a collimator module 405*b*" that is replaceable independently of other modules.

Although not shown in FIG. 19, one section 32 may be provided for a particular part of one of the columns 40, while another section 32 is provided to surround the beam paths of the same type of part of a plurality of other columns 40. For example, a first section 32*a* may surround the beam path in the source part of only the first column 40*a*. Meanwhile, a further section 32 may surround the beam paths in the source parts of both the second and third columns 40*b*, 40*c*.

As mentioned above, in some embodiments, there may be four or more columns 40, for example nine, one hundred or more. In some embodiments, a first section 32*a* surrounds the beam paths of the source parts of a first plurality of the columns 40. Meanwhile, a further section 32 may surround the beam paths of the source parts of a second plurality of the columns 40. Of course, this feature may be applied to other parts of the columns 40, such as the collimator parts.

In a variation of the arrangements shown in and described with respect to FIG. 19, reference to a single column may refer to a group of columns of a multi-column arrangement, for example as described with respect to FIG. 18.

At least some embodiments are expected to achieve benefits in regard to a multi-column multi-beam inspection beam apparatus 100. As shown in FIGS. 16-19, multiple multi-beam columns 40 are configured to inspect different locations of the same target 208, or different locations of different target 208. In some embodiments, the electron-optical components (e.g. condenser lens, objective lens) of the columns 40 are MEMS. At least some embodiments are expected to reduce and/or limit the radial extent of each of the individual columns 40.

In some embodiments, the MEMS components are field-replaceable. At least some embodiments are expected to facilitate maintenance of the apparatus 100 that comprises fragile components for example that may be susceptible to contamination from particulates present in the ambient atmosphere.

FIGS. 16-19 show a small number of specific combinations of parts. Any other combination of field-replaceable arrays and individually replaceable parts are of course also possible.

It is also possible for multiple electron-optical elements to be combined into a replaceable part of array, such as a beam-splitter and micro-stigmator, or an objective lens and detector, or an objective lens and detector and height sensor for part of the column 40.

For any of the field-replaceable parts or arrays shown above, the sections 32 may be flared as described above. In some embodiments, two or more sections 32 may be combined within a replaceable module. For example, one section 32 may be provided up-beam of the electron-optical component and one section may be provided down-beam of the electron-optical component. The sections 32 may be combined with the component in a field-replaceable module.

The electron-optical column 40 or multi-column apparatus may be a component of an inspection (or metro-inspection) tool or part of an e-beam lithography tool. The multi-beam charged particle apparatus may be used in a number of different applications that include electron microscopy in general, not just SEM, and lithography.

Throughout embodiments an electron-optical axis 304 is described. This electron-optical axis 304 describes the path of charged particles through and output from the source 301. The sub-beams and beamlets of a multi-beam may all be substantially parallel to the electron-optical axis 304 at least through the manipulators. The electron-optical axis 304 may be the same as, or different from, a mechanical axis of the electron-optical column 40.

While the embodiments of the present disclosure have been described in connection with various examples, other embodiments will be apparent to those skilled in the art from consideration of the specification and practice of the technology disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims and clauses set out below.

There is provided a number of clauses:

Clause 1: An electron-optical assembly for an electron-optical column for projecting a charged particle beam along a beam path towards a target, the electron-optical assembly comprising: electromagnetic shielding surrounding the charged particle beam path and configured to shield the charged particle beam from an electromagnetic field external to the electromagnetic shielding; wherein the electromagnetic shielding comprises a plurality of sections extending along different positions along the beam path, each section surrounding the charged particle beam path, wherein the sections are separable.

Clause 2: The electron-optical assembly of clause 1, wherein the sections are arranged such that a gap in the electromagnetic shielding is formed in the direction of the beam path, between adjacent sections.

Clause 3: The electron-optical assembly of clause 2, wherein the adjacent sections have facing surfaces that extend in a direction radial to the beam path, preferably by a distance at least as large as the gap between the adjacent sections.

Clause 4: The electron-optical assembly of any preceding clause, wherein at least one end of the section in the direction of the beam path comprises a flange extending in a direction radial to the beam path.

Clause 5: The electron-optical assembly of any preceding clause, comprising at least one electron-optical element between adjacent sections, preferably wherein the electron-optical element comprises a plurality of manipulators, preferably an array of manipulators.

Clause 6: The electron-optical assembly of any preceding clause, wherein the electromagnetic shielding is configured to shield the charged particle beam from an electric field.

Clause 7: The electron-optical assembly of any preceding clause, wherein the electromagnetic shielding is configured to shield the charged particle beam from a magnetic field.

Clause 8: The electron-optical assembly of any preceding clause, wherein the electromagnetic shielding comprises a magnetically permeable material.

Clause 9: The electron-optical assembly of any preceding clause, wherein the sections are arranged such that at least one section is moveable in a direction radial to the beam path independently of another of the sections.

Clause 10: The electron-optical assembly of any of any preceding clause, wherein at least two of the sections comprise adjoining ends which electromagnetically engage with each other.

Clause 11: The electron-optical assembly of clause 10 wherein the adjoining ends are dimensioned to be coaxially arranged.

Clause 12: The electron-optical column of clause 10 or 11, wherein the adjoining ends are dimensioned so that one end is insertable within the other.

Clause 13: The electron-optical column of any of clauses 10 to 12 wherein the adjoining ends are physically separate and electrometrically engaged.

Clause 14: The electron-optical assembly of any preceding clause, wherein at least one of the sections is provided with a mechanical reference member configured to allow the position of the section to be determined.

Clause 15: The electron-optical assembly of clause 14, wherein the mechanical reference member is configured to mechanically engage with a corresponding mechanical reference member of another of the sections or of the column.

Clause 16: A module comprising the electron-optical assembly of any preceding clause.

Clause 17: A module comprising an electron-optical device and an electromagnetic shielding of a beam path through the module when in an electron-optical column for projecting a charged particle beam along the beam path towards a target, the electromagnetic shielding comprising an up-beam section up-beam of the electron-optical device and a down-beam section down-beam of the electron-optical device, at least one of the up-beam and down-beam sections having an interface that extends in a direction radial to the beam path.

Clause 18: The module of clause 17, wherein the interface of the up-beam section forms an interface with up-beam elements of the column.

Clause 19: The module of clause 18, wherein the up-beam elements of the column comprise an upper beam section of the electromagnetic shielding, the interface of the up-beam section configured to be spaced away from the upper beam section by a gap when the module is present in an electron-optical column, preferably the gap at the most as large as the radial extent of interface of the up-beam section, preferably the at least one of the up-beam and down-beam sections comprises a flange extending in a direction radial to the beam path.

Clause 20: The module of any of clause 17 to 19, wherein the interface of the down-beam section forms an interface with up-beam elements of the column, wherein the interface of the up-beam interface is a facing surface preferably the interface provides the flange.

Clause 21: The module of clause 20, wherein the down-beam elements of the column comprise a lower beam section of the electromagnetic shielding, the interface of the down-beam section configured to be spaced away from the lower beam section by a gap when the module is present in an electron-optical column, preferably the gap at the most as large as the radial extent of interface of the down-beam section.

Clause 22: The module of any of clauses 17 to 21, wherein the electron-optical device is a MEMS device.

Clause 23: The module of any of clauses 16 to 22, wherein the module is a MEMS module.

Clause 24: The module of any of clauses 16 to 23, wherein the module is configured to be replaceable within the electron-optical column.

Clause 25: The module of clause 24, wherein the module is configured to be field replaceable.

Clause 26: The module of any of clauses 16 to 25 further comprising a mechanical reference member configured to allow the position of the module to be determined relative to the electron optical column, when in the column.

Clause 27: An electron-optical column comprising the module of any of clauses 16 to 25.

Clause 28: An electron-optical column comprising the electron-optical assembly of any of clauses 1 to 15.

Clause 29: The electron-optical column of clause 27 or 28, wherein the electromagnetic shielding is radially inward of one or more of a thermal conditioner configured to thermally condition at least a portion of the electron-optical column, a pump configured to reduce a pressure within the electron-optical column, and an electron optical element such as collimator configured to collimate the charged particle beam or a deflector configured to deflect the charged particle beam.

Clause 30: The electron-optical assembly of clause 29, wherein the thermal conditioner is configured to remove heat generated within the electron-optical column.

Clause 31: The electron-optical column of any of clauses 27 to 30, wherein at least one of the sections radially surrounds at least one component selected from the group consisting of a charged particle source, a condenser lens, a collimator, a source converter, a deflector array, an aperture array, an aberration compensator array, an image-forming element array, an objective lens array and a detector array.

Clause 32: The electron-optical column of clause 31, wherein the component is a MEMS component.

Clause 33: The electron-optical column of clause 31 or 32, wherein the section is arranged such it is moveable together with the component that it surrounds in a direction radial to the beam path independently of another of the sections.

Clause 34: The electron-optical column of any of clauses 31 to 33, wherein the section is field replaceable together with the component that it surrounds.

Clause 35: An apparatus comprising two or more of the electron-optical column of any of clauses 31 to 34.

Clause 36: The apparatus of clauses 35, wherein at least one of the sections radially surrounds the beam paths of two or more of the electron-optical columns.

Clause 37: The apparatus of clause 35 or 36, wherein the beam path of at least one of the electron-optical columns is radially outside of at least one of the sections.

Clause 38: The apparatus of any of clauses 35 to 37, wherein at least one of the sections radially surrounds the beam path of only one of the electron-optical columns.

Clause 39: The apparatus of any of clauses 35 to 38, wherein different sections of electromagnetic shielding radially surround beam paths of respective different electron-optical columns, the different sections being at overlapping positions in a direction parallel to the beam paths.

Clause 40: The apparatus of any of clauses 35 to 39, wherein a plurality of the sections at overlapping position in a direction parallel to the beam paths are arranged such that they are moveable together in a direction radial to the beam path independently of another of the sections.

Clause 41: A multi-column apparatus comprising: electron-optical columns configured to project respective charged particle beams along respective beam paths towards a target; a charged particle source configured to generate the charged particle beam for one or more of the electron-optical columns; and electromagnetic shielding surrounding the charged particle beam path of at least one of the electron-optical columns; wherein the electromagnetic shielding comprises a plurality of sections extending along different positions along the respective beam path, each section surrounding the charged particle beam path, wherein the sections are separable.

Clause 42: The multi-column apparatus of clause 41, wherein the columns are multi-beam columns configured to project a respect multi-beam of charged particles along respective beam paths towards the target.

Clause 43: The multi-column apparatus of clause 41 or 42, wherein the sections are arranged such that a gap in the electromagnetic shielding is formed in the direction of the beam path, between adjacent sections.

Clause 44: The multi-column apparatus of clause 43, wherein the adjacent sections have facing surfaces that extend in a direction radial to the beam path, preferably by a distance at least as large as the gap between the adjacent sections.

Clause 45: The multi-column apparatus of any of clauses 41 to 44, wherein the sections are arranged such that at least one section is moveable in a direction radial to the beam path independently of another of the sections.

Clause 46: The multi-column apparatus of any of clauses 41 to 45, wherein at least one of the sections is provided with a mechanical reference member configured to allow the position of the section in a direction parallel to the beam path to be determined.

Clause 47: The multi-column apparatus of any of clauses 41 to 46, wherein at least one of the sections radially surrounds at least one component selected from the group consisting of a charged particle source, a condenser lens array, a collimator array, a source converter, a deflector array, an aperture array, a corrector array, an aberration compensator array, an image-forming element array, an objective lens array and a detector array.

Clause 48: The multi-column apparatus of any of clauses 41 to 47, wherein the section is arranged such it is moveable together with the component that it surrounds in a direction radial to the beam path independently of another of the sections.

Clause 49: The multi-column apparatus of any of clauses 41 to 48, wherein at least one of the sections radially surrounds the beam paths of two or more of the electron-optical columns.

Clause 50: An electron-optical assembly for an electron-optical column for projecting a charged particle beam along a beam path towards a target, the electron-optical assembly comprising: electromagnetic shielding surrounding the charged particle beam path and configured to shield the charged particle beam from an electromagnetic field external to the electromagnetic shielding; wherein the electromagnetic shielding comprises a plurality of sections extending along, and surrounding, the beam path, wherein at least two of the sections are separable and comprise adjoining ends which electromagnetically engage with each other.

Clause 51: The electron-optical assembly of clause 50, wherein each section defines an aperture configured for passage of the beam path.

Clause 52: The electron-optical assembly of clause 50 or 51, wherein the plurality of sections extend sequentially along the beam path.

Clause 53: A method for making an electron-optical assembly for an electron-optical column for projecting a charged particle beam along a beam path towards a target, the method comprising: providing electromagnetic shielding to surround the charged particle beam and to shield the charged particle beam from an electromagnetic field external to the electromagnetic shielding; wherein the electromagnetic shielding comprises a plurality of sections extending along different positions along the beam path, each section surrounding the charged particle beam path, wherein the sections are separable.

Clause 54: The method of clause 53, wherein the electron-optical assembly is comprised in a module.

Clause 55: A method for replacing a module of an electron-optical column for projecting a charged particle beam along a beam path towards a target, the method comprising: removing the module from the electron-optical column, wherein the electron-optical column comprises electromagnetic shielding surrounding the charged particle beam path and configured to shield the charged particle beam from an electromagnetic field external to the electromagnetic shielding; wherein the electromagnetic shielding comprises a plurality of sections extending along different positions along the beam path, each section surrounding the charged particle beam path, wherein at least one of the sections is comprised in the module and is separable from others of the section up-beam and/or down-beam of the module.

Clause 56: A method for projecting a charged particle beam along a beam path towards a target, the method comprising: shielding the charged particle beam from an electromagnetic field external to the electromagnetic shielding; wherein the electromagnetic shielding comprises a plurality of sections extending along different positions along the beam path, each section surrounding the charged particle beam path, wherein the sections are separable.

Clause 57: The method of clause 56, comprising projecting charged particle beams along beam paths of respective electron-optical columns towards the target towards.

Clause 58: The method of clause 57, wherein at least one of the sections surrounds beam paths of two or more of the electron-optical columns and is arranged such it is moveable together with one or more components that it surrounds in a direction radial to the beam paths independently of another of the sections.

Clause 59: The method of clause 57 or 58, wherein different sections of electromagnetic shielding radially surround beam paths of respective different electron-optical columns, the different sections being at overlapping positions in a direction parallel to the beam paths and being arranged such that they are moveable together in a direction radial to the beam path independently of another of the sections.

Clause 60: A method operating an electron-optical assembly configured to project a charged particle beam along a beam path towards a target, the assembly comprising a plurality of electromagnetic shielding sections configured to shield the charged particle beam from an electromagnetic field external to the electromagnetic shielding and a module comprising an electron-optical device and configured to be removeable from the assembly, the method comprising: removing the module from the assembly, wherein the removing comprises radially moving a section of the electromagnetic shielding within the module, relative to the beam path.

Clause 61: The method of clause 60 further comprising replacing the module in the assembly comprising moving the section of the electromagnetic shielding within the module in a radial direction relative to the beam path so that the section faces an adjoining section of the electromagnetic shielding along the beam path, within the assembly.

The invention claimed is:

1. An electron-optical assembly for an electron-optical column for projecting a charged particle beam along a beam path towards a target, the electron-optical assembly comprising:

electromagnetic shielding surrounding the charged particle beam path and configured to shield the charged particle beam from an electromagnetic field external to the electromagnetic shielding;

wherein the electromagnetic shielding comprises a plurality of sections extending along different positions along the beam path, each section surrounding the charged particle beam path, wherein the sections are separable and the sections are arranged such that a gap in the electromagnetic shielding is formed in a direction of the beam path, between at least two adjacent sections, the adjacent sections having facing surfaces that extend in a direction radial to the beam path and at least one of the facing surfaces comprises a flange extending in a direction radial to the beam path, wherein the gap is defined by the facing surfaces of the adjacent sections and extends away from the beam path.

2. The electron-optical assembly of claim 1, wherein the facing surfaces extend in a direction radial to the beam path by a distance at least as large as the gap between the adjacent sections.

3. The electron-optical assembly of claim 1, comprising at least one electron-optical element between adjacent sections.

4. The electron optical assembly of claim 3, wherein the electron-optical element comprises a plurality of manipulators.

5. The electron-optical assembly of claim 1, wherein the electromagnetic shielding is configured to shield the charged particle beam from an electric field and/or magnetic field.

6. The electron-optical assembly of claim 1, wherein the electromagnetic shielding comprises a magnetically permeable material.

7. The electron-optical assembly of claim 1, wherein the sections are arranged such that at least one section is moveable in a direction radial to the beam path independently of another of the sections.

8. The electron-optical assembly of claim 1, wherein at least one of the sections is provided with a mechanical reference member configured to allow the position of the section to be determined.

9. The electron-optical assembly of claim 8, wherein the mechanical reference member is configured to mechanically engage with a corresponding mechanical reference member of another of the sections or of the column.

10. The electron-optical assembly of claim 8, wherein the mechanical reference member is configured to measure a position of one of the sections relative to an adjacent section.

11. The electron-optical assembly of claim 1, wherein at least one of the sections is provided with a mechanical reference member configured to allow the position of the section to be determined.

12. The electron-optical assembly of claim 11, wherein the mechanical reference member is configured to mechanically engage with a corresponding mechanical reference member of another of the sections or of the column.

13. An electron-optical column comprising the electron-optical assembly of claim 1.

14. The electron-optical column of claim 13, wherein the electromagnetic shielding is radially inward of one or more of a thermal conditioner configured to thermally condition at least a portion of the electron-optical column, a pump configured to reduce a pressure within the electron-optical column, and an electron optical element such as collimator configured to collimate the charged particle beam or a deflector configured to deflect the charged particle beam.

15. A module comprising:

an electron-optical device; and an electromagnetic shielding of a beam path through the module when in an electron-optical column for projecting a charged particle beam along the beam path towards a target, the electromagnetic shielding comprising:

an up-beam section up-beam of the electron-optical device; and a down-beam section down-beam of the electron-optical device, wherein at least one of the up-beam and down-beam sections comprises an interface that extends in a direction radial to the beam path, the at least one of the up-beam and down-beam sections comprises a flange extending in a direction radial to the beam path, wherein the interface of the up-beam section forms an interface configured for use with up-beam elements of the column, wherein the interface of the up-beam interface is a facing surface, wherein the up-beam elements of the column comprise an upper beam section of the electromagnetic shielding, the interface of the up-beam section configured to be spaced away from the upper beam section by a gap when the module is present in an electron-optical column, wherein the gap is defined by facing surfaces of the up-beam and down-beam sections and extends away from the beam path.

16. The module of claim 15, wherein the module is configured to be replaceable within the electron-optical column.

17. A method for projecting a charged particle beam along a beam path towards a target, the method comprising:

shielding the charged particle beam from an electromagnetic field external to the electromagnetic shielding;

wherein the electromagnetic shielding comprises a plurality of sections extending along different positions along the beam path, each section surrounding the charged particle beam path, wherein the sections are separable and the sections are arranged such that a gap in the electromagnetic shielding is formed in a direction of the beam path, between at least two adjacent sections, the adjacent sections having facing surfaces that extend in a direction radial to the beam path and at least one of the facing surfaces comprises a flange extending in a direction radial to the beam path, wherein the gap is defined by the facing surfaces of the adjacent sections and extends away from the beam path.

18. The method of claim 17, comprising projecting charged particle beams along beam paths of respective electron-optical columns towards the target.

* * * * *